United States Patent
Krutsick

(10) Patent No.: US 6,767,797 B2
(45) Date of Patent: Jul. 27, 2004

(54) METHOD OF FABRICATING COMPLEMENTARY SELF-ALIGNED BIPOLAR TRANSISTORS

(75) Inventor: Thomas J. Krutsick, Fleetwood, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 10/061,475

(22) Filed: Feb. 1, 2002

(65) Prior Publication Data
US 2003/0146477 A1 Aug. 7, 2003

(51) Int. Cl.[7] .................. H01L 21/8228; H01L 21/8238
(52) U.S. Cl. ...................................... 438/322; 438/203
(58) Field of Search ............................... 438/207, 322, 438/309, 323, 313, 203, 318, 348, 213, 205; 257/370, 587, 511, 588, 512, 517, 525, 526, 555, 569, 574, 576

(56) References Cited

U.S. PATENT DOCUMENTS

| | | |
|---|---|---|
| 4,435,896 A | 3/1984 | Parrillo et al. |
| 4,486,943 A | 12/1984 | Ryden et al. |
| 5,439,833 A | 8/1995 | Hebert et al. |
| 5,880,022 A | 3/1999 | Lee et al. |
| 5,885,880 A * | 3/1999 | Gomi .......................... 438/322 |
| 5,955,775 A * | 9/1999 | Miwa .......................... 257/587 |
| 6,043,126 A | 3/2000 | Kinzer |
| 6,087,234 A | 7/2000 | Wu |

* cited by examiner

Primary Examiner—Steven Loke

(57) ABSTRACT

Complementary bipolar transistors are fabricated on a semiconductor wafer by forming, first and second electrodes corresponding to first and second complementary transistors, respectively. A first impurity is selectively introduced into the first and second electrodes. A third electrode corresponding to the first transistor is formed, the third electrode being self-aligned with and electrically isolated from the first electrode, and a fourth electrode is formed corresponding to the second transistor, the fourth electrode being self-aligned with and electrically isolated from the second electrode. A second impurity is selectively introduced into the third and fourth electrodes. First active regions of the first and second transistors are formed, whereby the first impurity diffuses into the first active regions. Likewise, second active regions of the first and second transistors are formed, whereby the second impurity diffuses into the second active regions. A reduction in the number of fabrication steps and/or masks is thereby achieved.

13 Claims, 16 Drawing Sheets

CASE I

CASE II

CASE II

METHOD OF FABRICATING COMPLEMENTARY SELF-ALIGNED BIPOLAR TRANSISTORS

FIELD OF THE INVENTION

The present invention relates generally to semiconductor fabrication, and more particularly relates to techniques for reducing a number of steps and/or lithographic masks employed while fabricating complementary self-aligned transistors.

BACKGROUND OF THE INVENTION

The fabrication of integrated circuit (IC) devices, as used in very large scale integration (VLSI) applications, typically involves a complex sequence of well-known lithographic processing steps. Several of these processing steps are described, for example, in the text by Alan B. Grebene entitled "Bipolar and MOS Analog Integrated Circuit Design," John Wiley & Sons, 1984, Chap. 1, pp. 1–51, which is incorporated herein by reference. Accordingly, a detailed discussion of such conventional IC processing steps will not be presented herein.

Self-aligned bipolar transistors are known in the prior art. These transistors are advantageous in that they inherently have significantly reduced parasitics (e.g., capacitance), thus enabling the transistors to achieve faster speeds. Two common types of self-aligned bipolar transistors conventionally used in the industry are those having spacers outside the emitter of the device and those having spacers inside the emitter. Transistors having spacers outside the emitter generally employ one polysilicon layer for the emitter formation and are thus referred to as single-poly self-aligned transistors. Transistors having spacers inside the emitter generally use two polysilicon layers and are often referred to as double-poly self-aligned transistors.

Conventional approaches to manufacturing self-aligned complementary transistors involve the use of several additional masks or reticles and corresponding fabrication steps. For example, using an npn bipolar or bipolar complementary metal-oxide-semiconductor (BiCMOS) technology, the inclusion of a high performance vertical pnp transistor generally requires seven additional masks. Any increase in the number of masks and/or processing steps undesirably translates to an increase in the overall cost of IC fabrication. Moreover, each additional fabrication step presents an opportunity for the introduction of impurities into the resulting device, thus negatively impacting the manufacturing yield.

Accordingly, it is desirable to reduce the number of masking steps used for fabricating self-aligned complementary bipolar transistors to improve manufacturing yield and reduce the manufacturing cost.

SUMMARY OF THE INVENTION

The present invention provides techniques for reducing a number of fabrication steps and/or lithographic masks employed in the manufacture of self-aligned complementary bipolar transistors without increasing a complexity of the fabrication process. A reduction in the number of fabrication steps and/or masks reduces an overall cost and time of the fabrication process. Additionally, by reducing the number of fabrication steps, the present invention reduces a likelihood of introducing impurities into the IC device, thus improving the manufacturing yield.

In accordance with one aspect of the invention, a method of fabricating complementary bipolar transistors on at least a portion of a semiconductor wafer includes the steps of forming a first electrode corresponding to a first transistor, and a second electrode corresponding to a second transistor which is complementary to the first transistor. The first and second electrodes are formed on an upper surface of the semiconductor wafer. A first impurity is selectively introduced into the first and second electrodes. A third electrode is then formed corresponding to the first transistor, the third electrode being self-aligned with and electrically isolated from the first electrode. Likewise, a fourth electrode is formed corresponding to the second transistor, the fourth electrode being self-aligned with and electrically isolated from the second electrode. A second impurity is selectively introduced into the third and fourth electrodes. In addition, a first active region of the first transistor and a first active region of the second transistor are formed, whereby at least a portion of the first impurity associated with the first and second electrodes diffuses into the first active regions of the first and second transistors. Similarly, a second active region of the first transistor and a second active region of the second transistor are formed, whereby at least a portion of the second impurity associated with the third and fourth electrodes diffuses into the second active regions of the first and second transistors.

In an illustrative embodiment of the present invention, two layers of polysilicon are utilized which may either doped by implantation or doped in-situ, for example during a deposition step. An npn transistor is formed such that an npn emitter polysilicon and dopant (n-type) are also used to form a pnp base electrode. Similarly, a pnp transistor is formed such that a pnp emitter polysilicon and dopant (p-type) are also used to form an npn base electrode. In the npn transistor, the base electrode is self-aligned to and electrically isolated from the emitter electrode. In the pnp transistor, the emitter electrode is self-aligned to and electrically isolated from the base electrode.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative bipolar integrated circuit fabrication process suitable for use in forming complementary self-aligned bipolar transistors. It should be appreciated, however, that the present invention is not limited to the fabrication of this or any particular transistor device. Rather, the invention is more generally applicable to reducing the number of lithographic masks and corresponding fabrication steps in forming complementary self-aligned transistors. Moreover, although implementations of the present invention are described herein with specific reference to a bipolar fabrication process, it is to be appreciated that the invention is not limited to such a fabrication process, and that other suitable processes, such as, for example, a bipolar complementary metal-oxide-semiconductor (BiCMOS) fabrication process, may be similarly employed, as will be understood by those skilled in the art.

FIGS. 1 through 16 depict some of the stages or steps in an illustrative semiconductor fabrication process which may be used in forming complementary self-aligned bipolar transistors, in accordance with an illustrative embodiment of the present invention. With reference to each of these figures, there is shown a cross-section of at least a portion of a semiconductor wafer 144 during a particular stage in the fabrication of a pair of complementary transistor devices. It should be appreciated that these figures are not drawn to scale. The wafer may be formed of any desired size and is generally diced into a plurality of die or chips, each of the chips including one or more integrated circuits (ICs) or devices formed therein.

Figure 1:
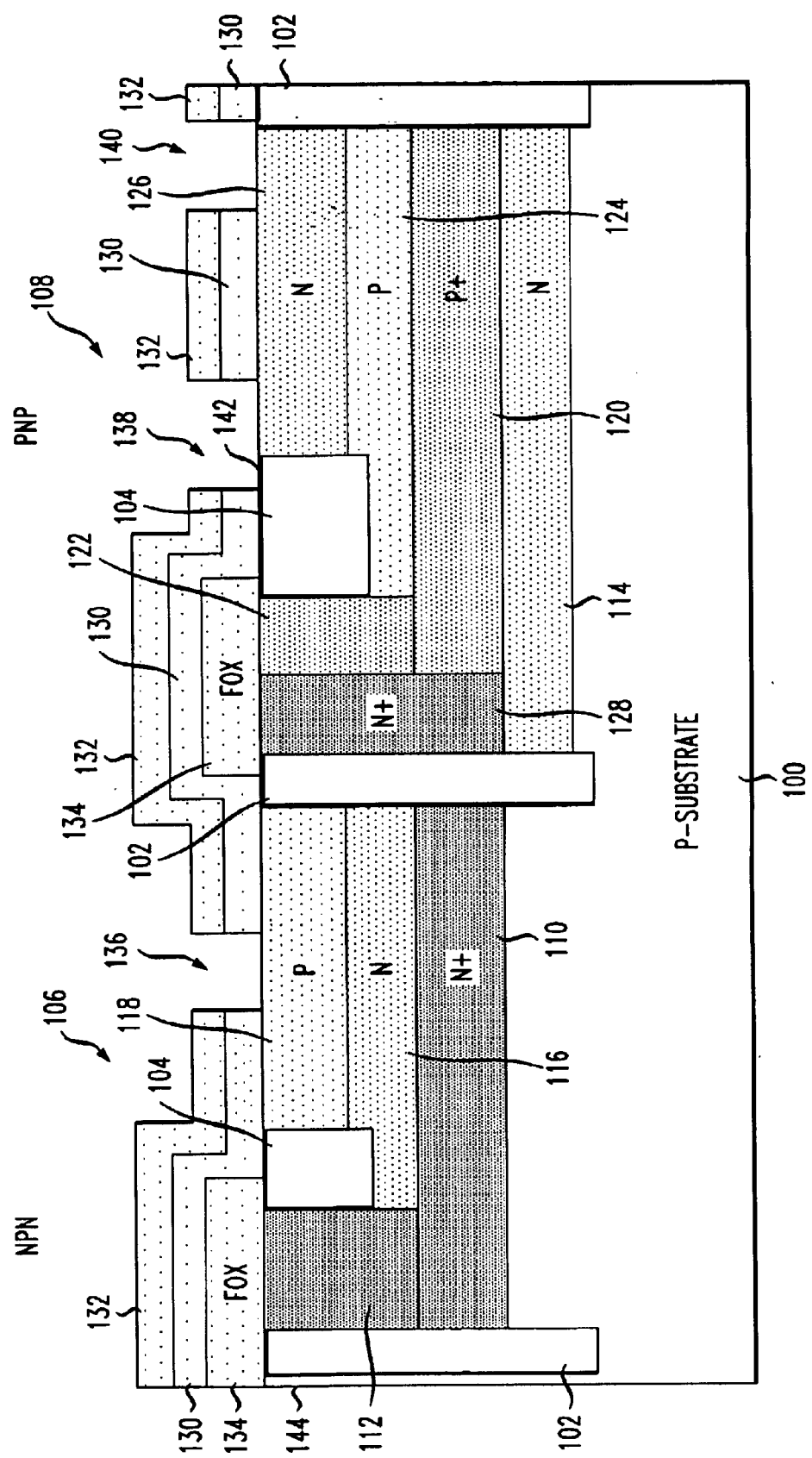
FIG. 1 is a cross-sectional view of at least a portion of a semiconductor wafer illustrating a step of defining an npn emitter contact and a pnp base contact for a pair of self-aligned complementary bipolar transistors, formed in accordance with the present invention.

FIG. 1 illustrates at least a portion of the semiconductor wafer 144 including a pair of partially fabricated complementary bipolar transistors, namely, an npn transistor and a pnp transistor, formed on a substrate 100. The substrate 100 is commonly formed of single-crystal silicon. Additionally, the substrate may have been modified by adding an impurity or dopant, such as by a diffusion or ion implant step, to change the conductivity of the material (e.g., n-type or p-type). In the illustrative embodiment shown in FIG. 1, for example, a p-type substrate 100 is employed, with a typical impurity concentration on the order of $10^{16}$ atoms per cubic centimeter ($cm^3$).

The term "substrate" as used herein refers to any material upon which other materials may be formed. The semiconductor wafer 144 comprises the substrate 100, with or without an epitaxial layer, and preferably includes one or more other layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a circuit element may be formed.

For ease of explanation, it is assumed that certain fundamental fabrication steps in the formation of the complementary bipolar transistors of the present invention have already been completed, in accordance with conventionally known techniques. For example, shown in FIG. 1 are a plurality of deep vertical isolation trenches 102 formed in the substrate 100 for isolating the complementary transistors 106 and 108 from one another and from other devices comprising the IC, and a plurality of field isolation regions 104 (e.g., shallow trench isolations (STIs) or local oxidation of silicon (LOCOS) regions) formed in the substrate to a depth that is comparatively more shallow than the vertical isolation trenches 102 using, for example, a poly-buffered LOCOS (PBL) process, as understood by those skilled in the art. The vertical isolation trenches 102 may be formed in the substrate using, for example, a conventional etching and filling process. The field isolation regions 104 may be used to isolate a base region of a respective transistor 106, 108, from a corresponding collector contact region. The field isolation regions 104 also provide a reduced sidewall component of the base capacitance associated with a given transistor. The vertical isolation trenches 102 and field isolation regions 104 are typically filled with a dielectric material, such as, for example, silicon dioxide, but may also be filled with a dielectric/polysilicon combination, as will be understood by those skilled in the art.

A low-resistivity (e.g., about 10 to 30 ohms per square) $n^+$-type buried layer 110 is formed in the substrate 100. The $n^+$-type buried layer 110 will eventually form the collector region of the resulting npn transistor 106. The buried layer 110 may be formed, for example, using an implantation and diffusion step of an impurity (e.g., arsenic or phosphorus), followed by an epitaxial growth step (e.g., epitaxial deposition or epitaxy). Buried layer 110 may alternatively be formed using a high energy implantation, thereby eliminating the need for the epitaxial growth step. In order to reduce a collector resistance in the npn transistor, an n$^+$-type sinker 112 is preferably added which electrically connects the buried layer 110 with a collector electrode (not shown) to be formed on an upper surface 142 of the semiconductor wafer 144. The n$^+$-type sinker 112 is typically formed using a deep n$^+$ implantation.

Similarly, a low resistivity p$^+$-type buried layer 120 is preferably formed in the substrate 100. The p$^+$-type buried layer 120 will eventually form a collector region of the resulting pnp transistor 108. Buried layer 120 may be formed, for example, using an implantation and diffusion step of an impurity (e.g., boron), followed by an epitaxial growth step. Alternatively, the buried layer 120 may be formed using a high energy implantation, thereby eliminating the need for the epitaxial growth step. A p$^+$-type sinker 122 may be added to reduce a collector resistance in the pnp transistor in a manner consistent with the n$^+$-type sinker 112 in the npn transistor 106, as previously described. The pnp transistor 108 also includes an n-type isolation layer or tub 114 for isolating the p$^+$-type buried layer 120 from the substrate 100. The isolation tub 114 maybe formed of single-crystal silicon, for example, by an implantation and diffusion step, followed by an epitaxial growth step. A connection to the isolation tub 114 may be provided by way of an n$^+$-type sinker 128 which electrically connects the isolation tub with a tub contact (not shown) to be formed on the upper surface 142 of the semiconductor wafer 144.

An n-type silicon layer 116 formed above the n$^+$-type buried layer 110 of the npn transistor 106 generally comprises residual epitaxial layer which forms an intrinsic collector of npn transistor 106. This n-type silicon layer 116 plays an important role in controlling certain characteristics associated with the transistor, such as, but not limited to, breakdown voltage and early voltage, and preferably isolates the collector region, comprised of buried layer 110, from a base region 118 of the transistor. The base region 118 of the npn transistor 106 is preferably formed by a p-type implantation into the n-type silicon layer 116. The n-type silicon layer 116 is generally formed of single-crystal silicon. Similarly, for the pnp transistor 108, a p-type silicon layer 124 formed above the p$^+$-type buried layer 120 isolates the collector region of the pnp transistor 108 from the base region, which is formed by an n-type implantation into the p-type silicon layer 124.

A plurality of thick field oxide (FOX) regions 134 maybe formed (e.g., grown or deposited) on the upper surface of the semiconductor wafer to provide isolation between devices on the substrate and/or structures comprising these devices. The FOX regions 134 are preferably formed using, for example, a conventional lithography process and etching steps to etch a silicon nitride-silicon dioxide composition layer. After a photoresist layer used to pattern the silicon nitride-silicon dioxide composition layer is removed, such as by etching, thermal oxidation in an oxygen-steam environment maybe used to grow the FOX regions 134 to a desired thickness, typically about 1000 to 5000 angstroms (Å), as understood by those skilled in the art. The present invention contemplates that other suitable alternative materials may be used to form the FOX regions 134.

A silicon dioxide layer 130 is shown deposited or grown on the upper surface 142 of the wafer 144 using, for example, a conventional chemical vapor deposition (CVD) process. The oxide layer 130 may be comprised of tetraethyl orthosilicate (TEOS). An alpha-silicon (α-silicon) layer 132 is preferably deposited or grown on the TEOS oxide layer 130 using, for example, a conventional deposition process, as understood by those skilled in the art. The α-silicon layer 132 maybe formed, for example, of polymorphous silicon which generally has a much smaller grain size compared to polycrystalline silicon. Due to the smaller grain size, the α-silicon layer 132 provides greater line width control for patterning and etching predetermined areas of the semiconductor wafer.

As shown in FIG. 1, contact openings or windows 136, 138 and 140 are etched through the deposited oxide layer 130 and the α-silicon layer 132 down to the single-crystal silicon surface 142 in each respective contact window. The contact windows 136, 138, 140 are used in one or more subsequent processing steps to form electrical contacts with predetermined regions of the transistors, as will be described in further detail herein. Contact window 136 will be used to form an emitter contact of npn transistor 106 and contact windows 138, 140 will be used to form base contacts of pnp transistor 108.

Figure 2:
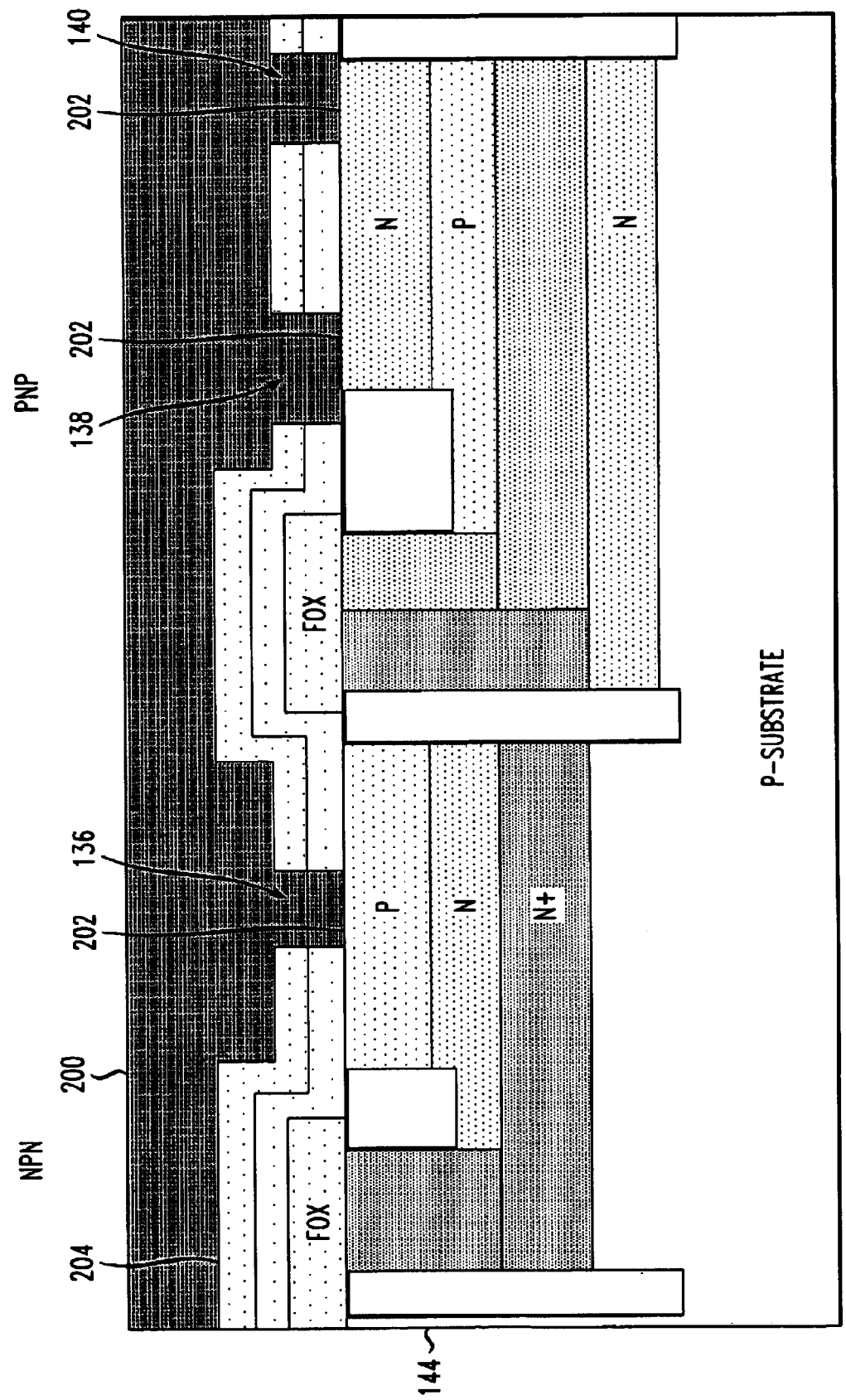
FIG. 2 is a cross-sectional view illustrating the steps of depositing a first polysilicon layer and performing an interface breakup for the pair of self-aligned complementary transistors shown in FIG. 1, in accordance with the present invention.

FIG. 2 depicts a step of depositing a first polysilicon layer 200 on a surface 202, 204 of the semiconductor wafer 144. Preferably, a rapid thermal anneal (RTA) step is performed to remove any residual oxide between the first polysilicon layer 200 and the single-crystal silicon surface 202. The RTA step advantageously enables the gain and emitter resistance of a given transistor to be more closely controlled. An RTA process suitable for use with the present invention may involve, for example, placing the semiconductor wafer in a vertical furnace at 1075 degrees Celsius for ten seconds.

Figure 3:
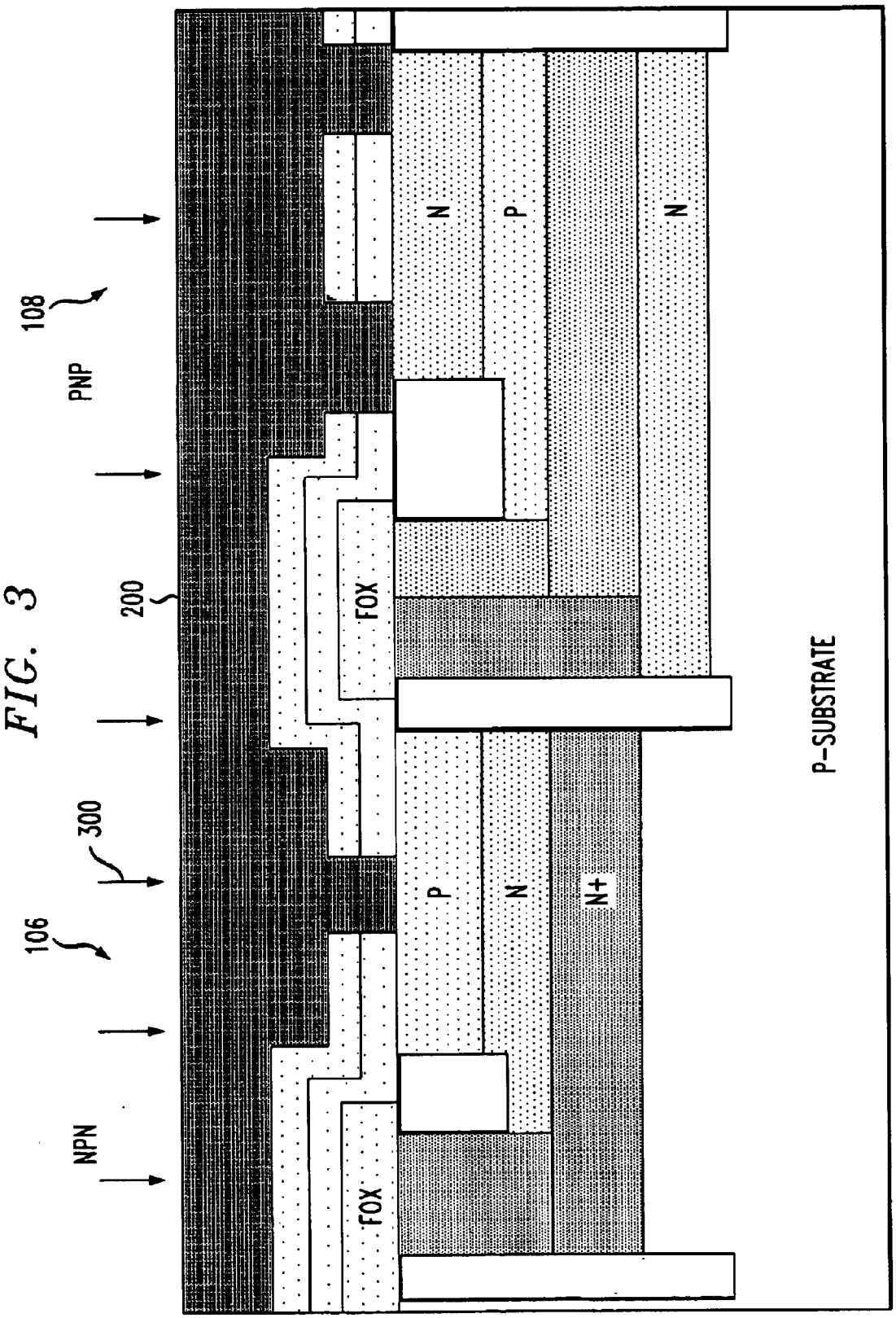
FIG. 3 is a cross-sectional view illustrating a step of implanting the first polysilicon layer with arsenic for the pair of self-aligned complementary transistors shown in FIG. 2, in accordance with the present invention.

FIG. 3 depicts a step of selectively implanting the first polysilicon layer 200 with an impurity, such as, for example, arsenic or phosphorus, to eventually form an emitter contact of the npn transistor 106 and base contacts of the pnp transistor 108. The step of doping the first polysilicon layer with an impurity may be performed, for example, by an ion implantation process, as indicated by arrows 300. The first polysilicon layer may also be doped in-situ, for example during a deposition step. In a preferred ion implantation process, arsenic ions, at a concentration of about $10^{16}$ ions per square centimeter (ions/cm$^2$), are accelerated to a high velocity by an electric field having an intensity of about 80 kilo-electron-volts (KeV).

Figure 4:
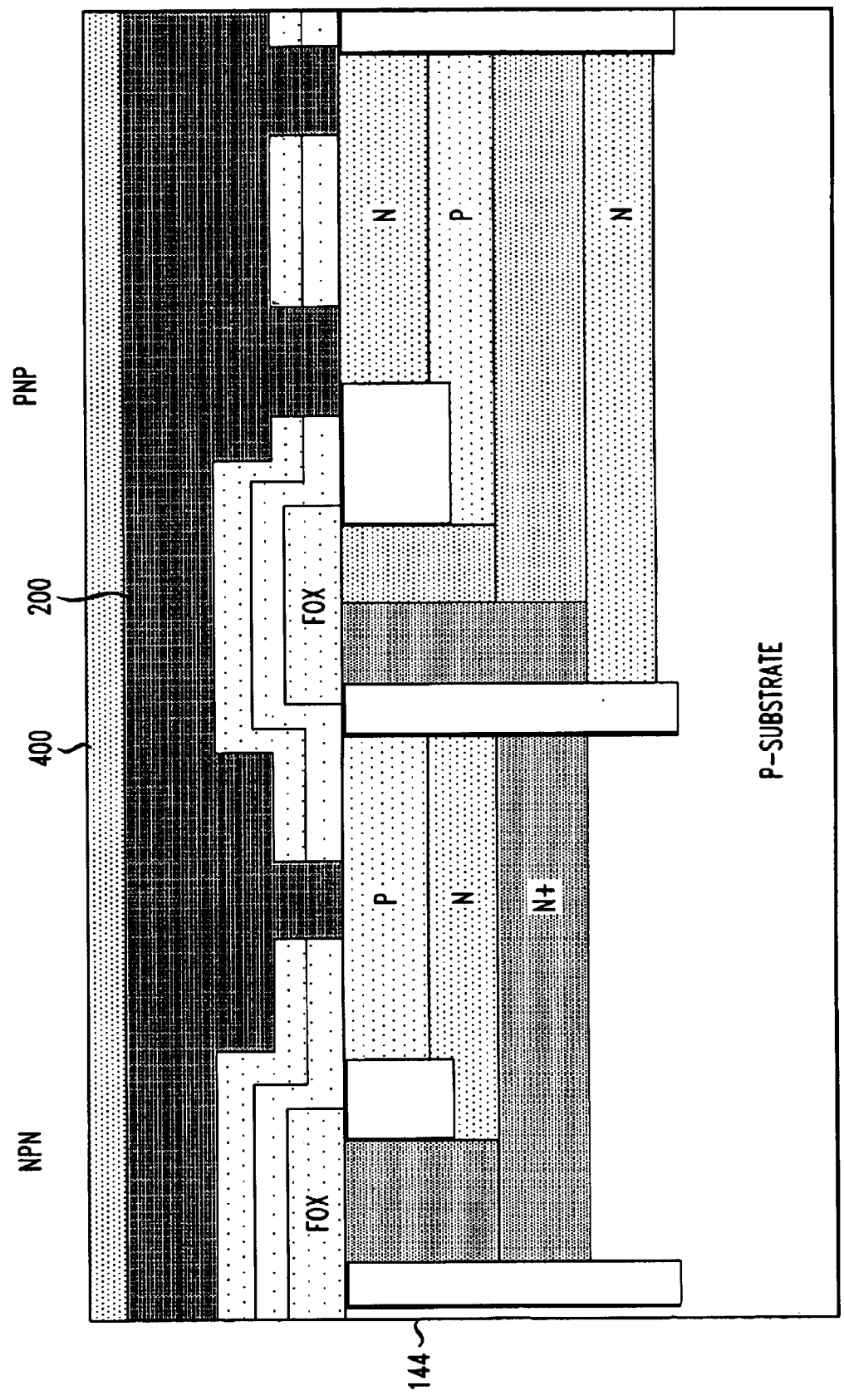
FIG. 4 is a cross-sectional view illustrating a step of depositing a hard mask layer on the first polysilicon layer for the pair of self-aligned complementary transistors shown in FIG. 3, in accordance with the present invention.

FIG. 4 illustrates a step of depositing a hard mask layer 400 on the first polysilicon layer 200. The hard mask layer 400 may be comprised of an oxide, for example, silicon dioxide or silicon nitride, that can be patterned using a conventional lithographic process to define predetermined areas of the semiconductor wafer 144 to be subsequently etched. Compared to a photolithographic mask or reticle, which may be used in place of the hard mask layer, the hard mask layer provides improved control over line width and/or etch variation, thus providing finer etch resolution. It is to be appreciated that the hard mask layer may be patterned using either positive or negative lithography, as understood by those skilled in the art. The hard mask layer may also be thermally grown from the first polysilicon layer 200 itself, rather than being deposited or grown on the first polysilicon layer, as previously described.

Figure 5:
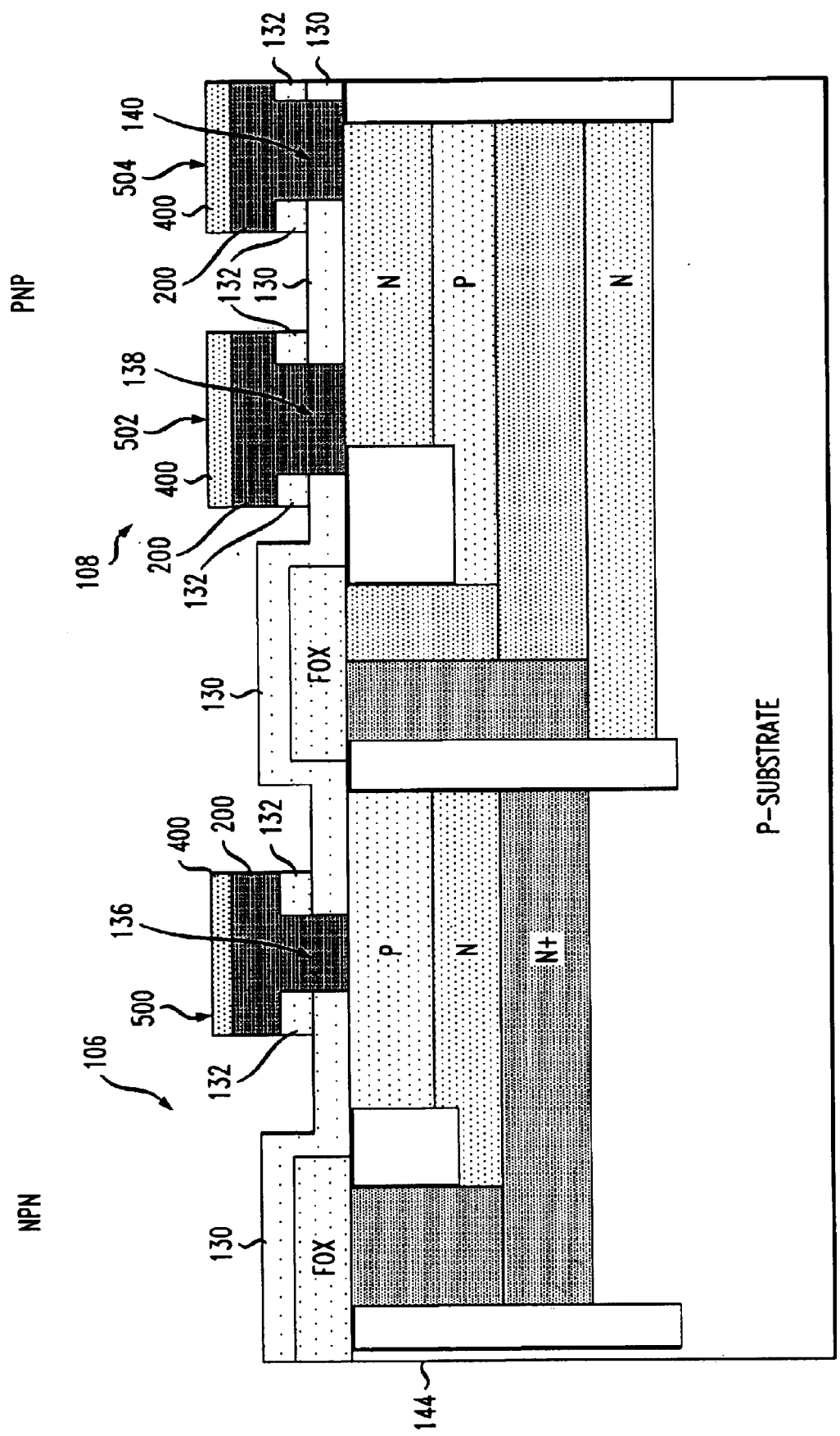
FIG. 5 is a cross-sectional view illustrating the steps of etching the first polysilicon layer and etching an alpha silicon layer for the pair of self-aligned complementary transistors shown in FIG. 4, in accordance with the present invention.

FIG. 5 illustrates the semiconductor wafer 144 following an etch step in which predetermined areas of the semiconductor wafer have been etched or removed down to the deposited oxide layer 130, in accordance with the invention.

The etch step may be performed using various conventional etching techniques, including, but not limited to, wet etching (e.g., hydrofluoric acid (HF), phosphoric acid, nitric acid, etc.), dry or plasma etching, or a combination of dry etching and wet etching (e.g., reactive-ion etching (RIE)), as understood by those skilled in the art. As apparent from the figure, an emitter electrode 500 of the npn transistor 106 and base electrodes 502 and 504 of the pnp transistor 108 each include the hard mask layer 400 and the first polysilicon layer 200. The hard mask layer 400 of each of the electrodes 500, 502, 504 preferably extends beyond each of the respective contact windows 136, 138, 140 by a predetermined amount (e.g., 0.4 microns ($\mu$m)) such that after etching, $\alpha$-silicon layers 132 remain overlapping onto the deposited oxide layer 130. The amount of extension or overlap onto the deposited oxide layer 130 may be based, for instance, on the alignment tolerance for the particular fabrication process employed.

Figure 6:
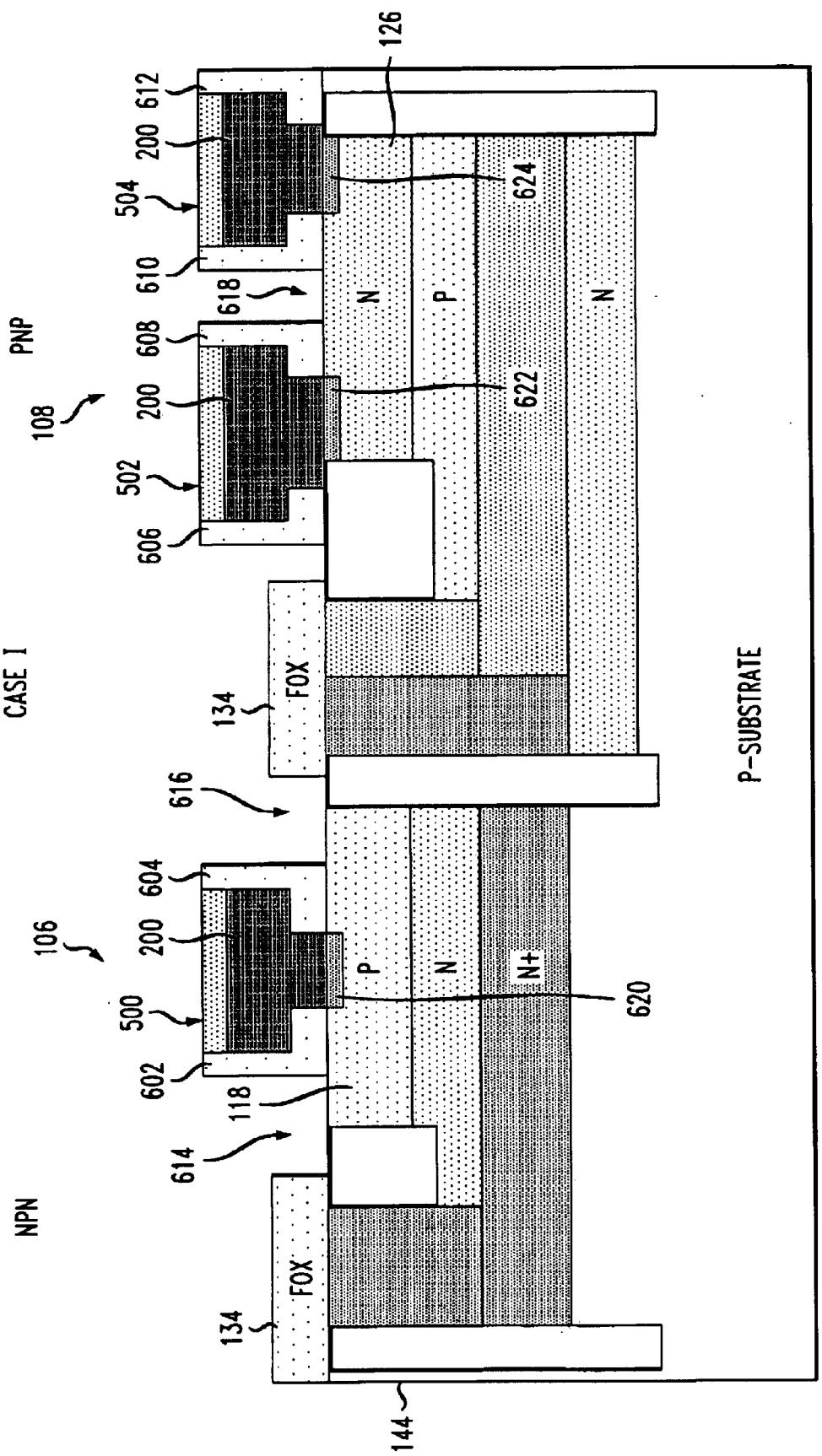
FIG. 6 is a cross-sectional view illustrating the steps of depositing a spacer oxide layer on the first polysilicon layer and etching the spacer oxide layer for the pair of self-aligned complementary transistors shown in FIG. 5, in accordance with one aspect of the present invention.

With reference now to FIG. 6, there is shown the semiconductor wafer 144 after a deposition step and one or more subsequent etching steps have been performed, in accordance with a first illustrative embodiment (Case I) of the present invention. During the deposition step, a silicon dioxide layer (not shown), or other suitable oxide layer (e.g., silicon nitride), is deposited or grown over the wafer 144 using a standard deposition process, such as, for example, vacuum deposition, sputtering, CVD, etc. The deposited silicon dioxide layer preferably comprises, for example, a TEOS oxide film. The deposited silicon dioxide layer is preferably removed using, for example, conventional reactive-ion etching, although other alternative etching techniques may be similarly employed by the present invention, as will be understood by those skilled in the art.

Sidewall spacers 602 and 604, 606 and 608, 610 and 612 are preferably formed on sidewalls of the electrodes 500, 502, 504, respectively, in accordance with the invention. In order to achieve this, it is to be appreciated that the silicon dioxide layer deposited on the sidewalls of the electrodes 500, 502, 504 will generally be thicker relative to the silicon dioxide layer deposited on horizontal portions of the semiconductor wafer 144 (e.g., on an upper surface of FOX regions 134). Thus, after anisotropic etching has been completed, the silicon dioxide layer on the horizontal portions of the wafer will be removed and the silicon dioxide layer on the sidewalls of the corresponding electrodes 500, 502, 504 will remain. The sidewall spacers 602, 604, 606, 608, 610, 612 will electrically isolate the respective electrodes 502, 504, 506 from other structures and thus enable the electrodes 500, 502, 504 to be utilized for forming self-aligned contacts (not shown) to other active regions (e.g., emitter and base regions) of the complementary bipolar transistors 106, 108.

For example, using the self-alignment techniques of the present invention, the emitter electrode 500 and corresponding sidewall spacers 602, 604 of npn transistor 106, in combination with adjacent FOX regions 134, are preferably used to form base contact windows 614 and 616 of the same npn transistor, thus eliminating the need for a separate mask step as is conventionally required. The width of the base contact windows 614, 616 of the npn transistor 106 are determined, at least in part, by the width of the emitter electrode 500 and corresponding sidewall spacers 602, 604, as well as the relative proximity of the emitter electrode 500 to the adjacent FOX regions 134. Similarly, the base electrodes 502, 504 and corresponding sidewall spacers 608, 610, respectively, are preferably used as an emitter contact window 618, without the need for a separate mask step. The width of the pnp emitter contact window 618 is determined, at least in part, by the width of the pnp base electrodes 502, 504 and thickness of corresponding sidewall spacers 608, 610, as well as the relative proximity of the base electrodes 502, 504 with respect to one another. It is to be appreciated that, in addition to eliminating one or more mask steps in the fabrication of the complementary bipolar transistors 106, 108, the techniques of the present invention advantageously reduce a base resistance of a transistor since, for a given transistor, the base contact(s) can be formed closer in relative proximity to the emitter contact of the transistor.

The $\alpha$-silicon layer (132 in FIG. 5) is converted into polysilicon material such that the first polysilicon layer 200 comprising electrode 500 is substantially homogeneous. The conversion of the $\alpha$-silicon layer may be done, for example, by heat treating the semiconductor wafer 144, as will be understood by those skilled in the art. In a similar manner, the $\alpha$-silicon layers in electrodes 502 and 504 may also be converted to polysilicon material such that each of the respective contacts are substantially homogeneous.

By selectively heat treating the semiconductor wafer 144, at least a portion of the impurities (e.g., arsenic) present in the doped first polysilicon layer 200 of electrode 500 diffuses into p-type silicon layer 118, forming an $n^+$-type emitter region 620 in the p-type silicon layer of the npn transistor 106. As previously stated, the p-type silicon layer 118 is used to form the base region of the npn transistor 106 in a prior processing step. Similarly, at least a portion of the impurities present in the doped first polysilicon layer 200 of electrodes 502 and 504 diffuses into n-type silicon layer 126 of the pnp transistor 108, thereby forming $n^+$-type base contact regions 622, 624, respectively, in the n-type silicon layer 126. As previously described, the n-type silicon layer 126 is used to form the base region of the pnp transistor 108 in a prior processing step. A controlled RTA step may be performed to set the gain of the npn transistor 106 to an intermediate value.

Figure 7:
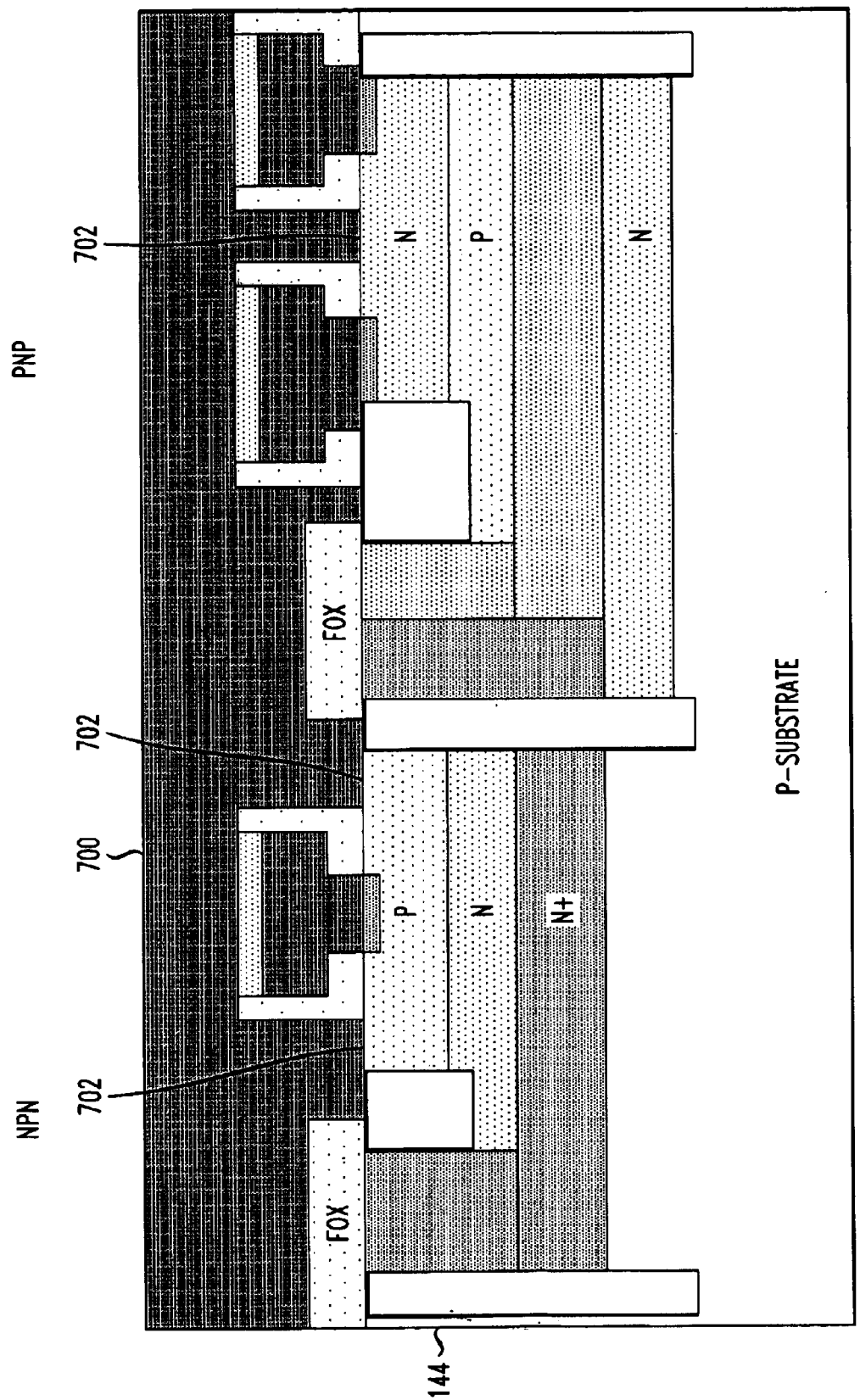
FIG. 7 is a cross-sectional view illustrating a step of depositing a second polysilicon layer on the structure shown in FIG. 6, in accordance with the present invention.

FIG. 7 depicts a step of depositing a second polysilicon layer 700 on the upper surface of the semiconductor wafer 144. In a manner consistent with the deposition of the first polysilicon layer, an RTA step is preferably performed to substantially remove any residual oxide present in the interface between the second polysilicon layer 700 and the single-crystal silicon surface 702. As previously described, the RTA step advantageously enables the gain and emitter resistance of a given transistor to be more closely controlled.

Figure 8:
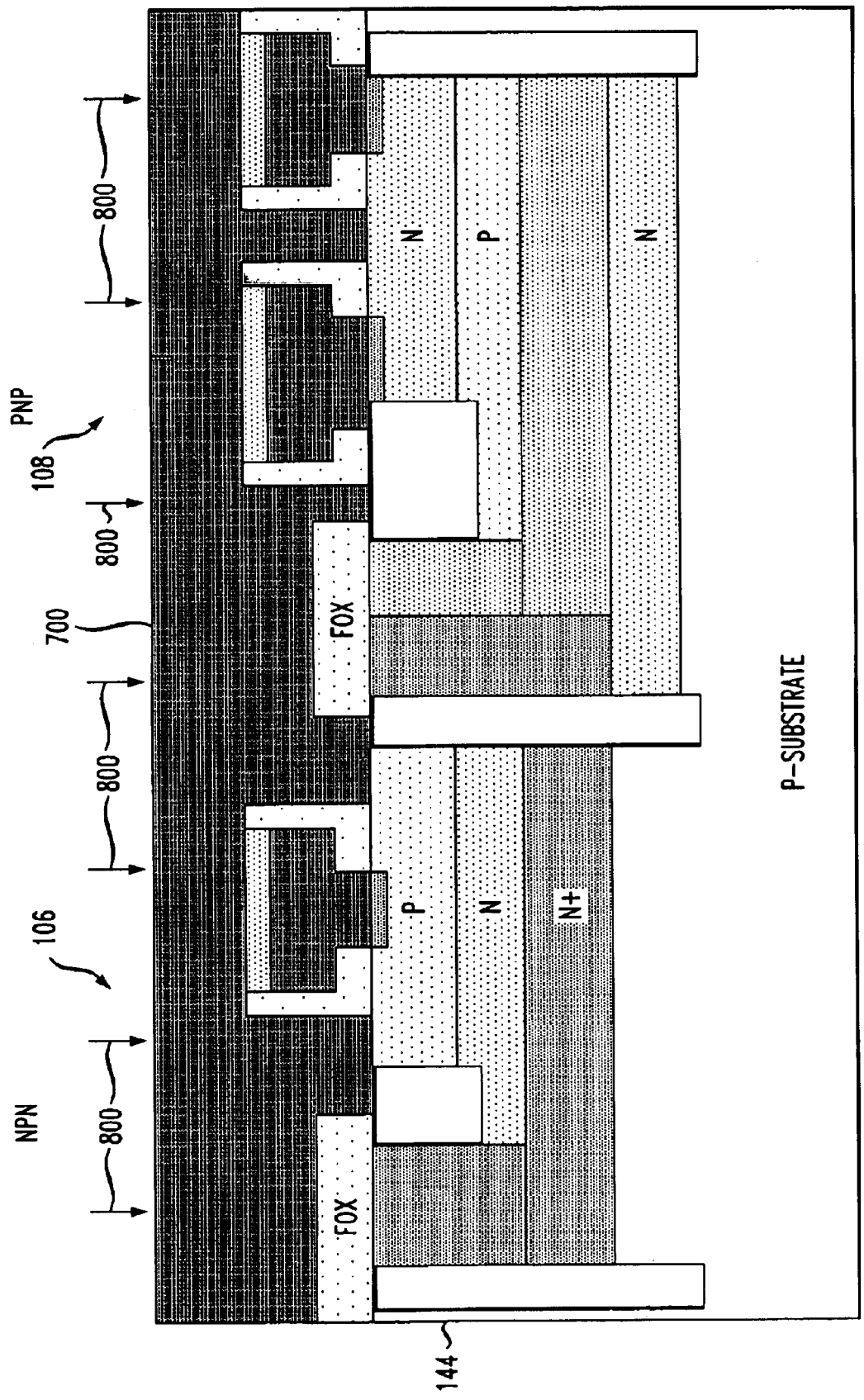
FIG. 8 is a cross-sectional view illustrating a step of implanting the second polysilicon layer with boron for the pair of self-aligned complementary transistors shown in FIG. 7, in accordance with the present invention.

In FIG. 8 there is shown a step of selectively implanting the second polysilicon layer 700 with an impurity, such as, but not limited to, boron, to eventually form one or more base electrodes of the npn transistor 106 and an emitter electrode of the pnp transistor 108. The step of implanting the second polysilicon layer 700 with an impurity may be performed by ion implantation, as indicated by arrows 800. The second polysilicon layer may also be doped in-situ, for example during a deposition step. In a preferred ion implantation process, for example, boron ions at a concentration of about $10^{16}$ ions/cm$^2$ are accelerated to a high velocity by an electric field having an intensity of about 30 KeV.

Figure 9:
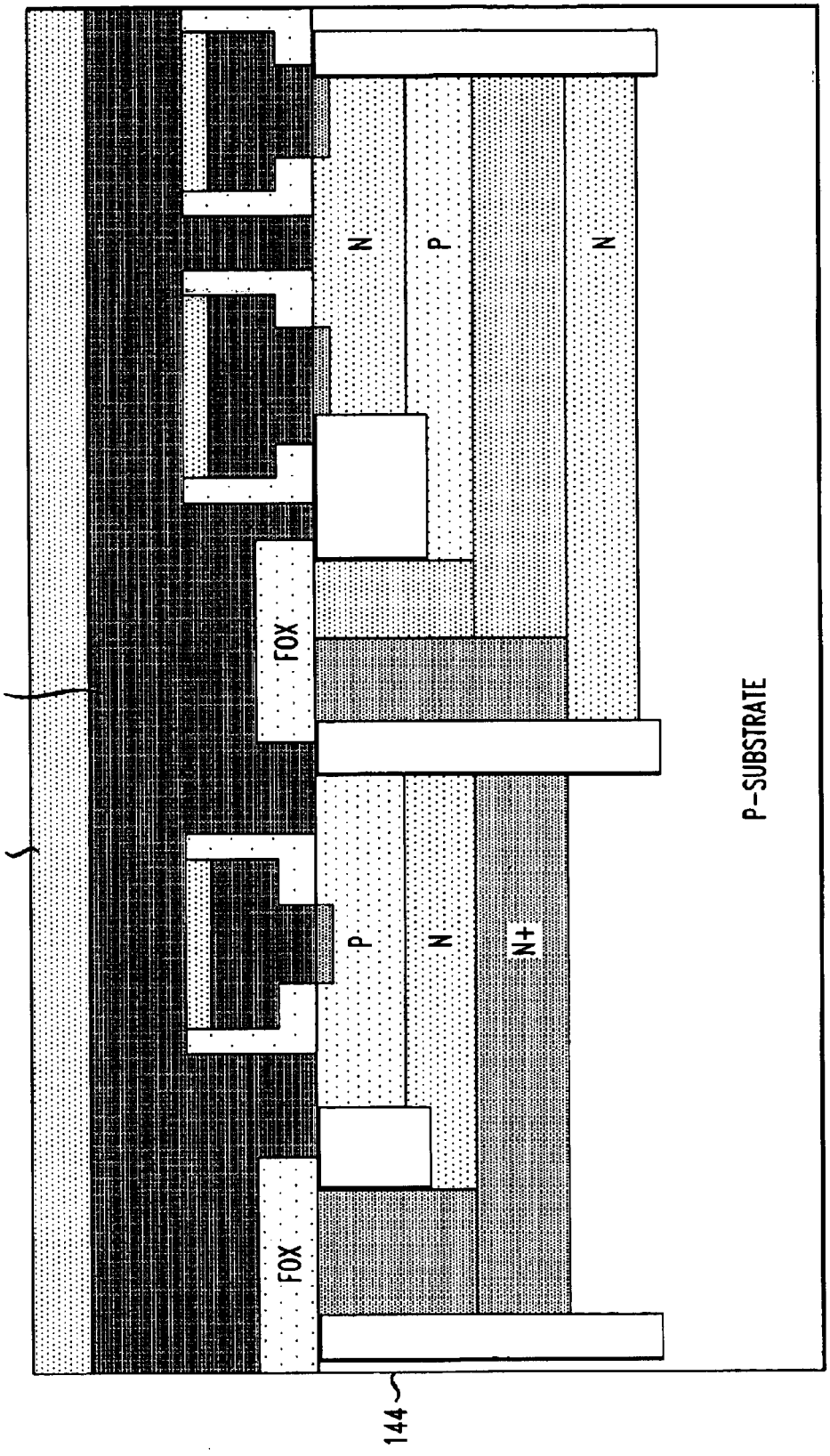
FIG. 9 is a cross-sectional view illustrating a step of depositing a hard mask layer on the second polysilicon layer for the pair of self-aligned complementary transistors shown in FIG. 8, in accordance with the present invention.

FIG. 9 illustrates a step of forming (e.g., depositing) a hard mask layer 900 on an upper surface of the second polysilicon layer 700 of semiconductor wafer 144. The hard mask layer 900 is preferably formed in a manner consistent with the hard mask layer 400 previously described in connection with FIG. 4. Hard mask layer 900 preferably comprises an oxide, such as, for example, silicon dioxide or silicon nitride, and may be patterned in a conventional manner to define predetermined areas of the semiconductor wafer 144 to be etched. It is to be appreciated that the hard mask layer 900 may also be thermally grown from the second polysilicon layer 700 itself, rather than being deposited on the second polysilicon layer, as previously explained.

Figure 10:
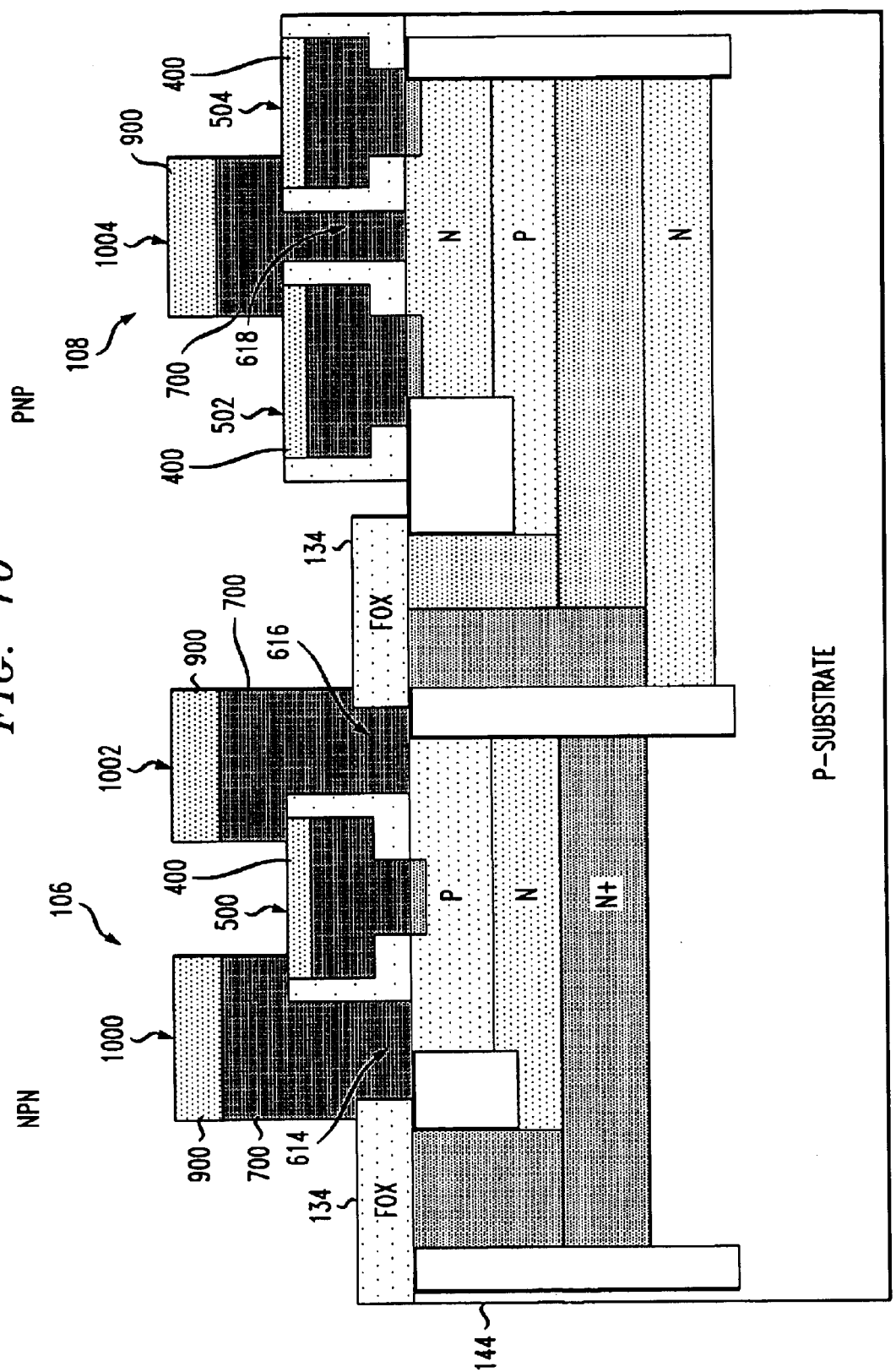
FIG. 10 is a cross-sectional view illustrating a step of etching the hard mask layer and the second polysilicon layer for the structure shown in FIG. 9, in accordance with the present invention.

With reference now to FIG. 10, the semiconductor wafer 144 is shown following an etching process, wherein predetermined areas of the semiconductor wafer have been removed in accordance with the patterning of the hard mask layer 900, as explained above. The etching process may be performed in a manner consistent with the etch step described above in connection with FIG. 5, and is preferably performed using, for example, standard reactive ion etching for a predetermined period of time. Regions of the wafer 144 that are protected by hard mask layer 900 will remain after etching. These regions will subsequently form base electrodes 1000 and 1002 of npn transistor 106 and an emitter electrode 1004 of pnp transistor 108. Similarly, regions of the wafer protected by the previously deposited hard mask layer 400 associated with electrodes 500, 502 and 504, will also remain after the etching process. FOX regions 134 function essentially as an etch stop for the etching process.

As apparent from the figure, electrodes 1000, 1002, 1004, which comprise second polysilicon layer 700 and hard mask layer 900, overlap onto an upper surface of structures adjacent to the respective electrodes. For example, base electrodes 1000 and 1002, which fill base contact windows 614 and 616, respectively, of npn transistor 106, each overlap onto at least a portion of emitter electrode 500 and adjacent FOX regions 134 by a predetermined amount. The minimum amount of overlap or extension will depend primarily on design tolerances for the particular fabrication process used. Similarly, emitter electrode 1004, which fills emitter contact window 618 of pnp transistor 108, overlaps onto at least a portion of base electrodes 502, 504.

Figure 11:
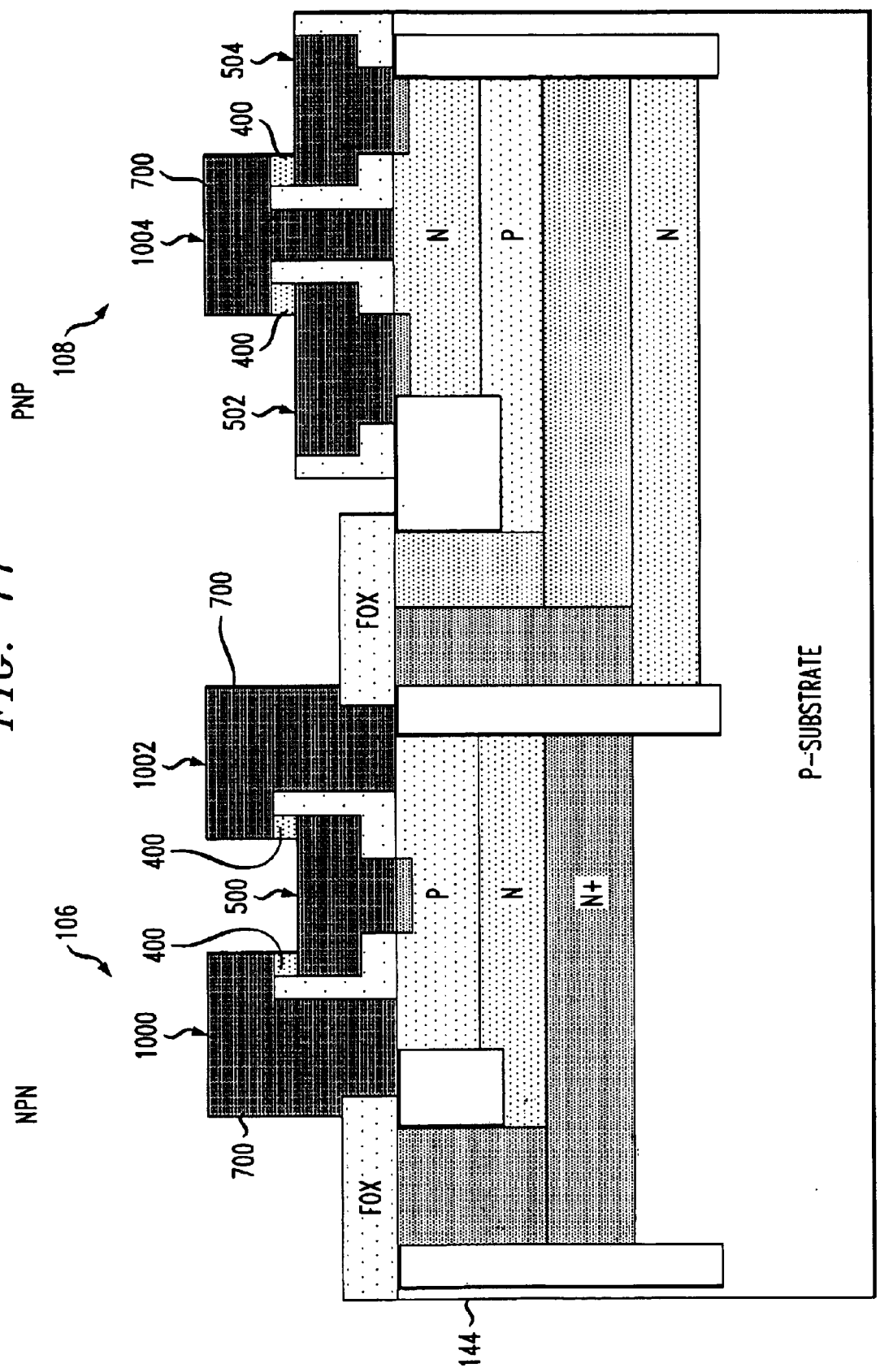
FIG. 11 is a cross-sectional view illustrating a step of removing the hard mask layer shown in FIG. 10, in accordance with the present invention.

FIG. 11 depicts a step of removing the hard mask layers associated with each of the electrodes 1000, 1002, 1004, 500, 502, 504 of semiconductor wafer 144. The hard mask layers may be removed using a conventional etching process, such as, for example, an HF etch for a predetermined period of time, as will be understood by those skilled in the art. Portions of the hard mask layer 400 associated with electrodes 500, 502, 504 may remain after etching. As apparent from the figure, since these areas of the hard mask layer 400 are overlapped by second polysilicon layer 700 comprising electrodes 1000, 1002, 1004, they will be unexposed to the etch solution and thus will not be removed by the etching process.

Figure 12:
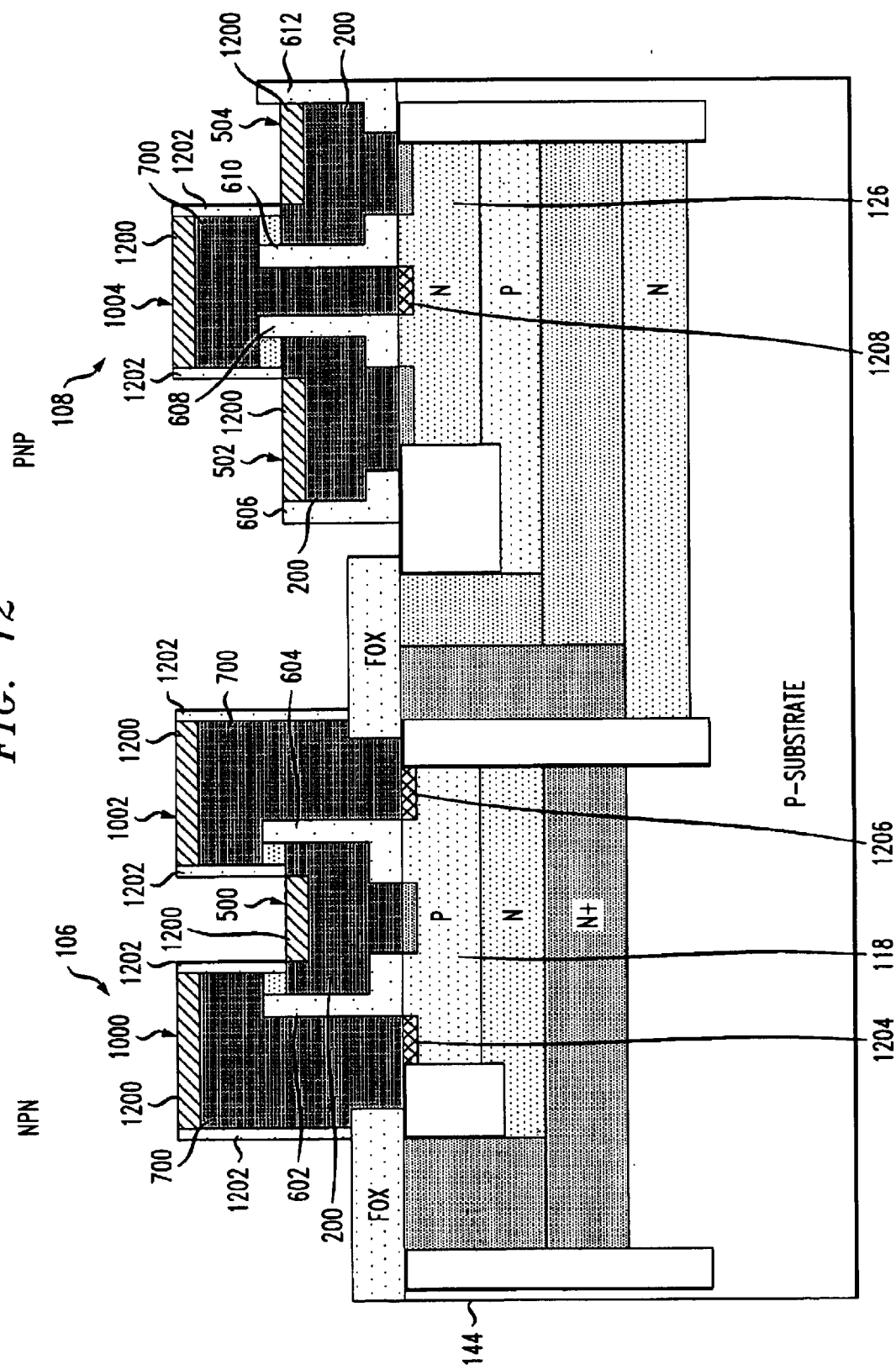
FIG. 12 is a cross-sectional view illustrating a step of depositing a sidewall oxide layer and a silicide layer on the second polysilicon layer for the pair of self-aligned complementary transistors shown in FIG. 11, in accordance with the present invention.

FIG. 12 illustrates a sidewall oxidation step of semiconductor wafer 144. The semiconductor wafer 144 is depicted after a deposition step and a subsequent etching process have been completed, in accordance with the present invention. During the deposition step, a silicon dioxide layer 1202 is deposited or grown over the wafer 144 using a standard deposition process, such as, for example, vacuum deposition, sputtering, CVD, etc. The deposited silicon dioxide layer 1202 preferably comprises, for example, a TEOS oxide film. The deposited silicon dioxide layer 1202 is preferably removed using, for example, a reactive-ion etch step, although other alternative etching techniques may be similarly employed by the present invention, as appreciated by those skilled in the art.

Sidewall spacers 1202 are preferably formed on sidewalls of the electrodes 1000, 1002, 1004, in accordance with the present invention. As previously explained, in order to achieve this, it is to be appreciated that the silicon dioxide layer deposited on the sidewalls of the electrodes 1000, 1002, 1004, will generally be thicker relative to the silicon dioxide layer deposited on horizontal portions of the wafer. Thus, after anisotropic etching, the silicon dioxide layer on the horizontal portions of the wafer will be removed and the silicon dioxide layer on the sidewalls of the corresponding electrodes 1000, 1002, 1004 will remain. Analogous to the sidewall spacers 602, 604, 606, 608, 610, 612 shown in FIG. 6, sidewall spacers 1202 will electrically isolate the respective electrodes 1000, 1002, 1004 from other structures formed on the semiconductor wafer 144.

By selectively heat treating the semiconductor wafer 144, at least a portion of the impurities (e.g., boron) comprising the doped second polysilicon layer 700 of electrodes 1000 and 1002 diffuse into p-type silicon layer 118, forming $p^+$-type base regions 1204 and 1206, respectively, in the p-type silicon layer of the npn transistor 106. Similarly, at least a portion of the impurities comprising the doped second polysilicon layer 700 of electrode 1004 diffuse into n-type silicon layer 126, forming a $p^+$-type emitter region 1208 in the n-type silicon layer of the pnp transistor 108. A controlled RTA step may be performed to set the gain of the npn transistor 106 and pnp transistor 108 to a desired value.

With continued reference to FIG. 12, with an upper surface of the electrodes 500, 502, 504, 1000, 1002, 1004 being exposed, a layer of platinum 1200 maybe deposited on the upper surface of the semiconductor wafer 144. The exposure of the electrodes to the ambient atmosphere often results in the formation of parasitic oxide layers (not shown) over areas of the IC to be interconnected. Therefore, to provide good ohmic contact, the interconnecting metal should be chemically active so that it can be alloyed through these parasitic oxide layers. The deposition of platinum on the electrodes not only protects the electrodes from parasitic oxidation, but it also helps form a better ohmic contact with the respective underlying polysilicon material.

When the first polysilicon layers 200 and second polysilicon layers 700 of the respective electrodes react with the deposited platinum layer 1200 (e.g., at a temperature of about 600 to 700 degrees Celsius), a platinum silicide (PtSi) alloy is formed. Platinum silicide has a relatively low resistivity (e.g., 25 to 35 ohm-cm), and is therefore a suitable material for forming a good ohmic contact between the respective polysilicon material, comprising layers 200 and 700, and an interconnection metal layer to be deposited in a subsequent processing step. Any unreacted platinum may be removed from the wafer 144 using, for example, a conventional etching process. It is to be appreciated that other silicides may alternatively be employed with the present invention, such as, but not limited to, titanium silicide, cobalt silicide, etc.

Figure 13:
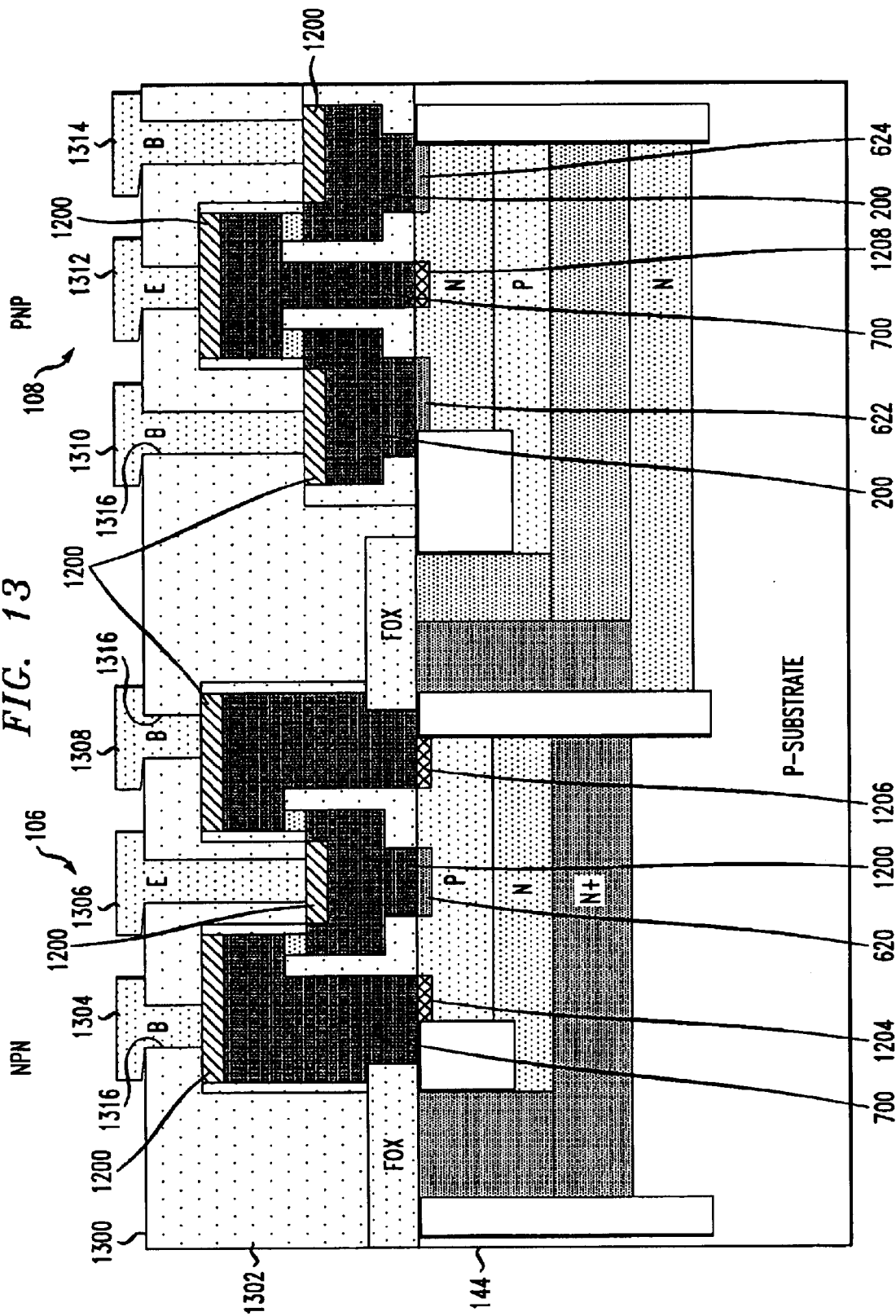
FIG. 13 is a cross-sectional view illustrating the steps of dielectric isolation formation, contact window formation and metal layer deposition for the pair of self-aligned complementary transistors shown in FIG. 12, in accordance with the present invention.

FIG. 13 illustrates a step of depositing a dielectric layer 1302 on the semiconductor wafer 144 such that an upper surface 1300 of the wafer is substantially planar, a process often referred to as planarization. The dielectric layer 1302 preferably comprises silicon dioxide, although other suitable materials may be employed (e.g., silicon nitride, etc.). Following the planarization process, a contact mask step is preferably used to open contact windows 1316 in the oxide layer 1302 over the emitter (E), base (B) and collector (not shown) electrodes of the transistors 106, 108. Alternatively, one or more contact windows 1316 may be formed outside of the active emitter and base regions of the respective transistors, and therefore contact with a corresponding emitter and/or base region may be made via a polysilicon or metal trace, as will be understood by those skilled in the art. The contact windows 1316 may be formed in the oxide layer

1302 by patterning the oxide layer using a conventional lithography process and then etching the oxide layer with, for example, an HF etch solution. The entire wafer 144 is then coated with a thin (e.g., about one micron) layer of metal which will interconnect one or more circuit elements comprising the IC.

The actual interconnect pattern is preferably defined by a mask step in which desired portions of the metal layer are removed, such as by etching, according to a standard lithography process, as known by those skilled in the art. Thus, as shown in the figure, the resulting npn transistor 106 includes an emitter contact 1306 that is electrically coupled to the underlying n$^+$-type emitter region 620 via first polysilicon layer 200 and platinum silicide layer 1200. The npn transistor 106 also includes base contacts 1304, 1308, each contact being electrically coupled to an underlying p$^+$-type base region 1204, 1206, respectively, via second polysilicon layer 700 and platinum silicide layer 1200. Likewise, the resulting pnp transistor 108 includes base contacts 1310 and 1314, each of which are electrically coupled to underlying n$^+$-type base regions 622, 624, respectively, and an emitter contact 1312 which is electrically coupled to a corresponding underlying p$^+$-type emitter region 1208 of the pnp transistor. Although only a single metal layer is shown in the illustrative embodiment of FIG. 13, the present invention contemplates that multiple metal layers may be utilized. A passivation layer (not shown) may be deposited or grown as a final protection layer on the upper surface of the semiconductor wafer 144. The passivation layer may comprise silicon dioxide or an alternative dielectric material, as known by those skilled in the art.

Figure 14:
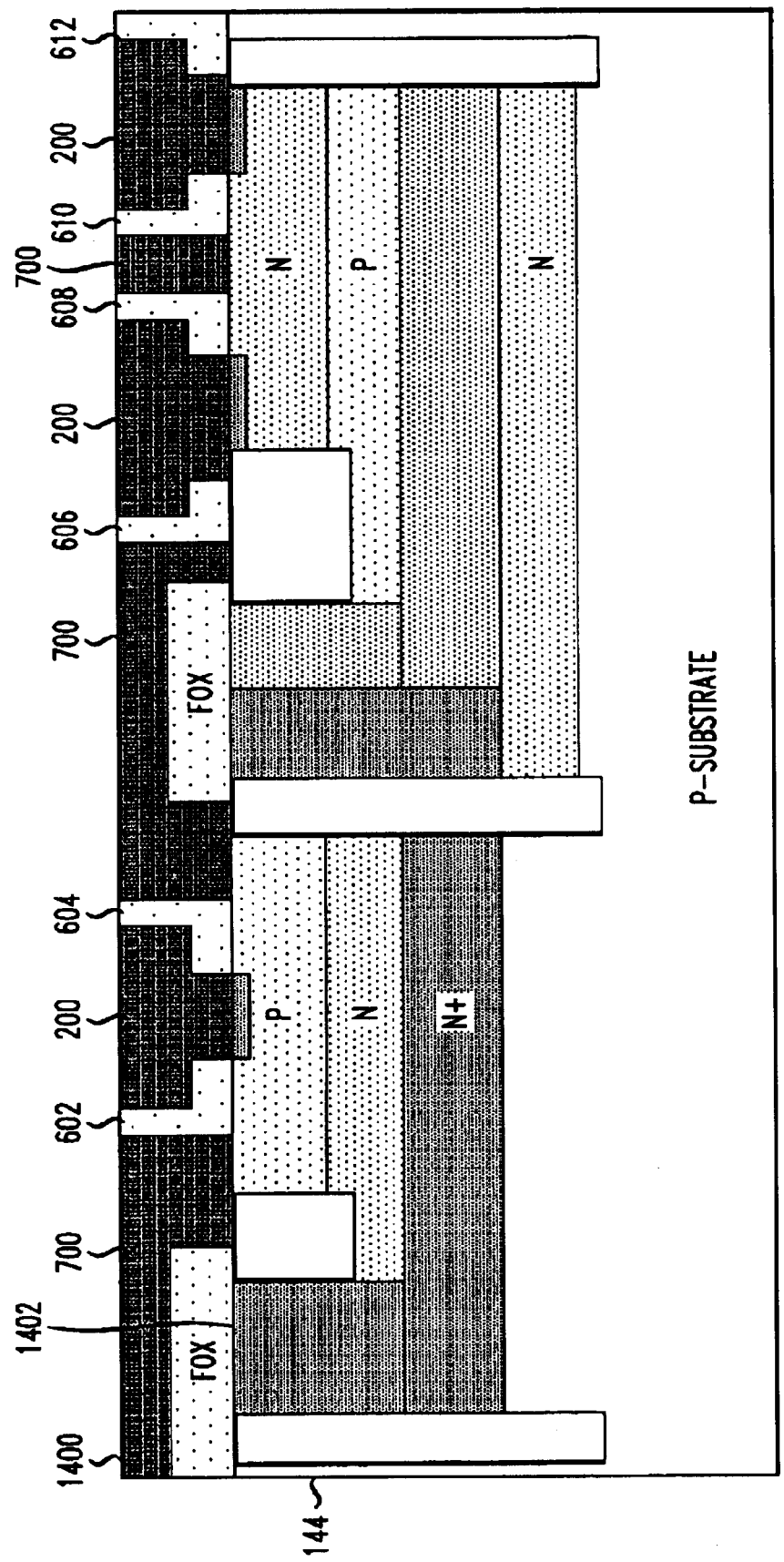
FIG. 14 is a cross-sectional view illustrating a blanket etch-back step for the pair of self-aligned complementary transistors shown in FIG. 8, in accordance with another aspect of the present invention.
Figure 15:
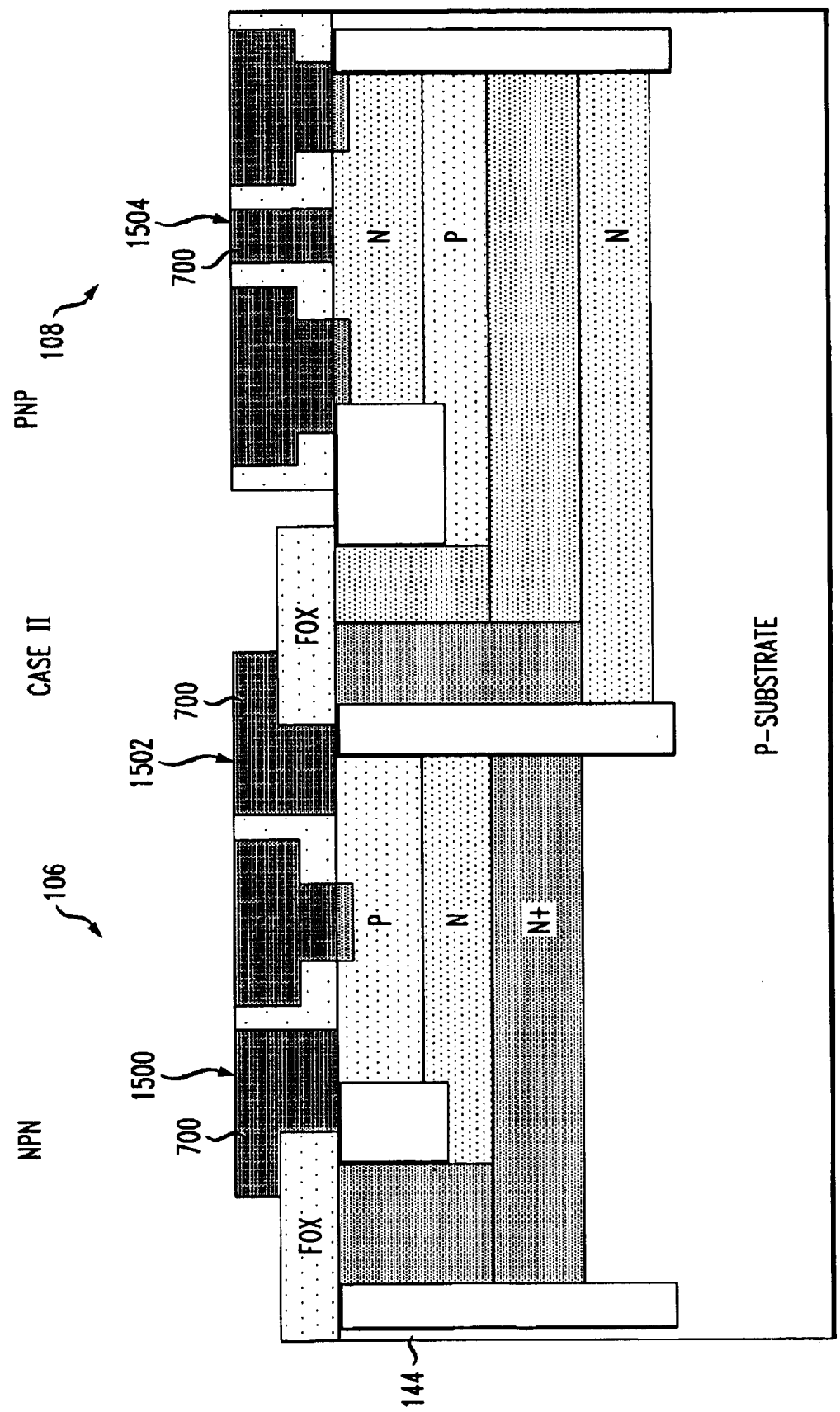
FIG. 15 is a cross-sectional view illustrating a step of gross etching the second polysilicon layer for the self-aligned complementary transistors shown in FIG. 14, in accordance with the present invention.
Figure 16:
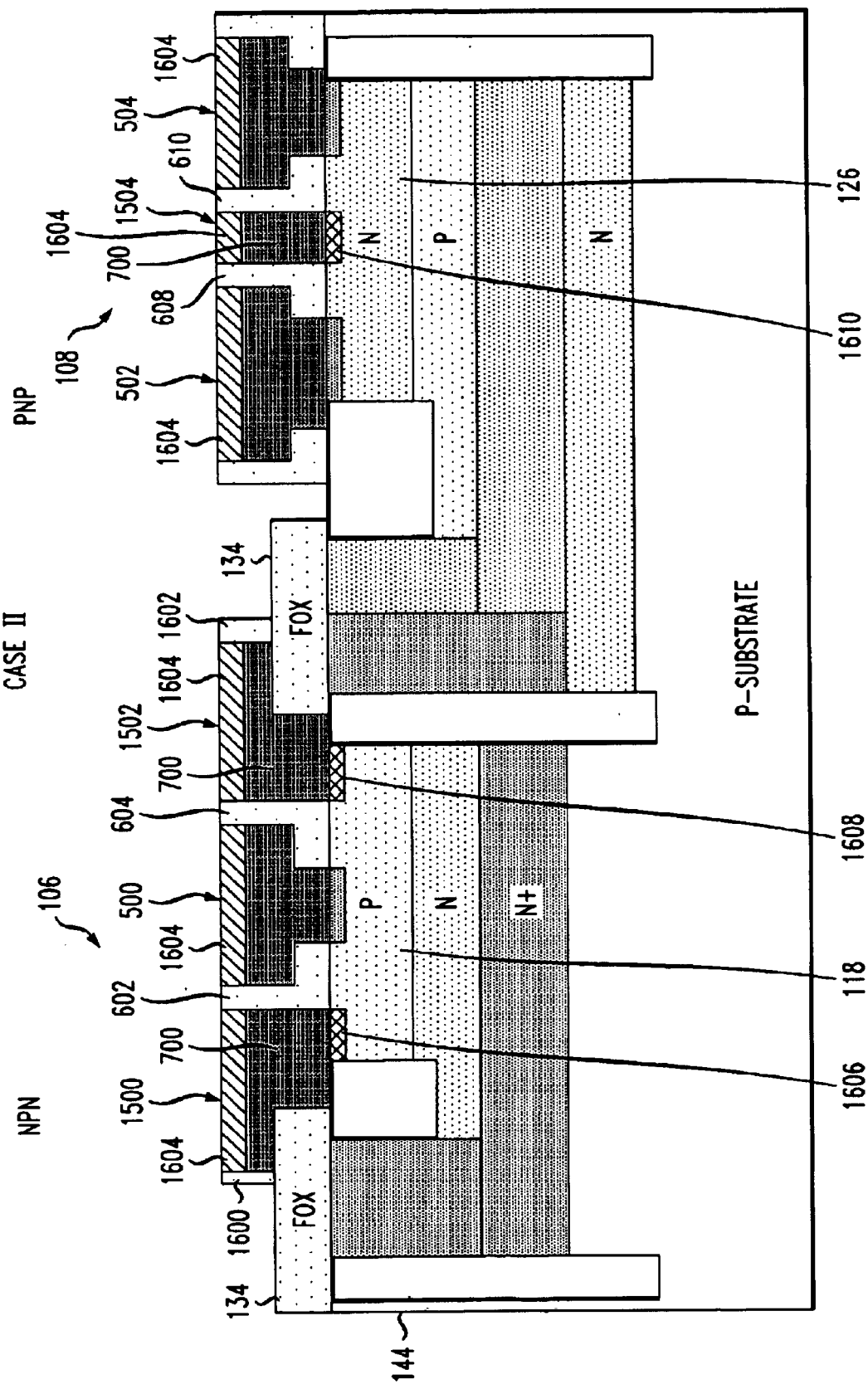
FIG. 16 is a cross-sectional view illustrating the steps of depositing a spacer oxide layer, etching the spacer layer and depositing a silicide layer on the second polysilicon layer for the pair of self-aligned complementary transistors shown in FIG. 15, in accordance with the present invention.

FIGS. 14 through 16 depict an alternative semiconductor fabrication technique that may be used in forming complementary self-aligned bipolar transistors, in accordance with another illustrative embodiment of the present invention (Case II). One or more processing steps in this alternative technique may be substituted for one or more processing steps previously described in connection with at least FIGS. 9 through 11. Again, using this alternative approach of the present invention to form complementary bipolar transistors, as will be explained in further detail below, an emitter contact of one transistor device is self-aligned with a base contact(s) of the same device. Similarly, a base contact of a complementary transistor device is self-aligned with an emitter contact of the same device.

FIG. 14 illustrates the semiconductor wafer 144 following a blanket etch-back step. The blanket etch-back is preferably performed after the deposition and impurity implantation of the second polysilicon layer 700, as described above and illustrated in FIG. 8. As will be understood by those skilled in the art, a blanket etch-back typically involves etching an upper surface 1400 of the wafer 144 for a predetermined length of time. Preferably, the blanket etch-back is stopped when at least a portion of each sidewall spacer 602, 604, 606, 608, 610, 612 is detected through the upper surface 1400 of the wafer. At this point, the thickness of the second polysilicon layer 700, as measured from the single-crystal silicon surface 1402 to the upper surface 1400 of the wafer is preferably a minimum of about 1000 angstroms. The present invention contemplates that suitable alternative processes may be employed for thinning down the upper surface of the wafer, such as, for example, backlapping or grinding.

As apparent from the figure, once the blanket etch-back step has been completed, the wafer 144 will be comprised of alternating regions of second polysilicon 700 and first polysilicon 200 which are electrically isolated from one another by the thickness of the respective sidewall spacers 602, 604, 606, 608, 610, 612. Not only does this technique eliminate one or more mask steps in the formation of the complementary bipolar transistors 106, 108, but the overlap of the base electrodes onto the emitter electrode of npn transistor 106, and similarly the overlap of the emitter electrode onto the base electrodes of pnp transistor 108, as illustrated in FIG. 10, may be advantageously eliminated. In this manner, a base-emitter capacitance ($C_{BE}$) associated with each of the complementary transistors can be significantly reduced.

FIG. 15 depicts the semiconductor wafer 144 after patterning the second polysilicon layer 700 and etching the wafer 144 to remove predetermined areas of the second polysilicon layer 700 to form electrodes 1000, 1002 of npn transistor 106 and electrode 1004 of pnp transistor 108. The patterning and etching steps may be performed using a conventional lithography process, as described above.

In FIG. 16 there is shown a step of forming sidewall spacers 1600 and 1602 on electrodes 1500 and 1502, respectively. This may be achieved by depositing or growing a layer of silicon dioxide on the semiconductor wafer 144. It is to be appreciated that the step of forming sidewall spacers may be eliminated, provided isolation between the electrodes 1500, 1502 and an adjacent device or structure is not required. Assuming such sidewall spacers are desired, the deposited silicon dioxide layer preferably comprises, for example, a TEOS oxide film. As previously explained, the silicon dioxide layer deposited or grown on the sidewalls of electrodes 1500 and 1502 will generally be thicker relative to the silicon dioxide layer deposited or grown on horizontal portions of the wafer (e.g., on an upper surface of FOX regions 134). Thus, after etching, the silicon dioxide layer on the horizontal portions of the semiconductor wafer will be removed and the silicon dioxide layer on the sidewalls of the corresponding electrodes 1500, 1502 will remain, forming sidewall spacers 1600, 1602, respectively. Just as sidewall spacers 602 and 604 are utilized to electrically isolate electrodes 1500, 500, 1502 from one another, the sidewall spacers 1600, 1602 are used to electrically isolate electrodes 1500 and 1502, respectively, from adjacent circuit elements or structures. For pnp transistor 108, electrode 1504 is already electrically isolated from adjacent electrodes 502 and 504 as a result of sidewall spacers 608 and 610, as previously described in connection with FIG. 6. Therefore no further isolation step is required.

By selectively heat treating (e.g., annealing) the semiconductor wafer 144, at least a portion of the impurities (e.g., boron) comprising doped second polysilicon layer 700 of electrodes 1500 and 1502 diffuse into p-type silicon layer 118, forming p+-type base contact regions 1606 and 1608, respectively, in the p-type silicon layer of the npn transistor 106. Similarly, at least a portion of the impurities comprising the doped second polysilicon layer 700 of electrode 1504 diffuse into n-type silicon layer 126, thereby forming a p$^+$-type emitter contact region 1610 in the n-type silicon layer of the pnp transistor 108. A controlled RTA step may be performed to set the gain of the npn transistor 106 and pnp transistor 108 to a desired value. Following the RTA step, a silicide step is preferably performed, for example, by depositing a layer of platinum over the wafer 144 so that a silicide layer 1604 is formed on electrodes 1500, 1502. This silicide step may be performed in a manner consistent with the silicide step previously described in connection with FIG. 12. A planarization process, etch process, and metalization process are then preferably performed on the semiconductor wafer 144 in the manner previously described in conjunction with FIG. 13.

In accordance with the techniques of the present invention, an emitter electrode of a first transistor is self-aligned with one or more base electrodes of the same transistor. Likewise, for a second transistor which is complementary to the first transistor, one or more base electrodes are self-aligned with an emitter electrode of the same transistor. Thus, the present invention advantageously provides techniques for forming complementary transistors in which one or more fabrication steps may be eliminated, thereby significantly reducing the cost and/or processing time associated with the manufacture of complementary transistors. Moreover, with a reduction in the number of processing steps required to form the complementary bipolar transistors, the likelihood of introducing undesirable impurities into the transistors is reduced, thus increasing manufacturing yield.

It is to be appreciated that, although the present invention has been described in conjunction with techniques for forming the emitter electrode of the npn transistor first and then self-aligning the base electrodes of the npn transistor with the emitter electrode of the npn transistor, the invention contemplates that the respective electrodes can be formed in the reverse order in a similar manner. Likewise, with regard to the pnp transistor, the order of fabricating the base and emitter electrodes of the pnp transistor can be reversed, such that the emitter electrode of the pnp transistor is formed first and then the base electrodes are self-aligned to the emitter electrode of the pnp transistor.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of fabricating complementary bipolar transistors on a semiconductor wafer, the method comprising the steps of:

forming a first electrode corresponding to a first transistor, and a second electrode corresponding to a second transistor which is complementary to the first transistor, the first and second electrodes being formed on an upper surface of the semiconductor wafer;

selectively introducing a first impurity into the first and second electrodes;

forming a third electrode corresponding to the first transistor, the third electrode being self-aligned with and electrically isolated from the first electrode, and forming a fourth electrode corresponding to the second transistor, the fourth electrode being self-aligned with and electrically isolated from the second electrode;

selectively introducing a second impurity into the third and fourth electrodes;

forming a first active region of the first transistor and a first active region of the second transistor, whereby at least a portion of the first impurity associated with the first and second electrodes diffuses into the first active regions of the first and second transistors; and forming a second active region of the first transistor and a second active region of the second transistor, whereby at least a portion of the second impurity associated with the third and fourth electrodes diffuses into the second active regions of the first and second transistors;

wherein at least one of:

the step of forming the first and second electrodes further comprises rapid thermal annealing the semiconductor wafer for substantially removing residual oxide between a first polysilicon layer, formed on the upper surface of the semiconductor wafer, and the upper surface of the semiconductor wafer; and the step of forming the third and fourth electrodes further comprises rapid thermal annealing the semiconductor wafer for substantially removing residual oxide between a second polysilicon layer, formed on the upper surface of the semiconductor wafer, and the upper surface of the semiconductor wafer.

2. The method of claim 1, further comprising the step of:

forming a dielectric spacer on a vertical sidewall portion of each of at least the first and second electrodes, the dielectric spacers electrically isolating at least the first and second electrodes from an adjacent structure formed on an upper surface of the semiconductor wafer.

3. The method of claim 2, wherein the step of forming the dielectric spacers comprises the steps of:

performing at least one of depositing an oxide layer on the upper surface of the semiconductor wafer and growing an oxide layer on an upper surface of the semiconductor wafer; and etching the oxide layer until the oxide layer on a horizontal portion of the semiconductor wafer is substantially removed and the oxide layer substantially remains on the sidewall portions of at least the first and second electrodes.

4. The method of claim 1, wherein the step of forming the first and second electrodes comprises the steps of:

forming the first polysilicon layer on the upper surface of the semiconductor wafer;

forming a hard mask layer on the first polysilicon layer;

selectively patterning the hard mask layer to define predetermined areas of the first polysilicon layer to be etched; and etching away the predetermined areas of the first polysilicon layer.

5. The method of claim 4, wherein the step of forming the third and fourth electrodes comprises the steps of:

forming the second polysilicon layer on the upper surface of the semiconductor wafer;

forming a hard mask layer on the second polysilicon layer;

selectively patterning the hard mask layer to define predetermined areas of the second polysilicon layer to be etched; and etching away the predetermined areas of the second polysilicon layer.

6. The method of claim 1, wherein the step of selectively introducing the first impurity into the first and second electrodes comprises implanting the first and second electrodes with a predetermined concentration of the first impurity.

7. The method of claim 1, further comprising the step of forming a silicide layer on an upper surface of at least one electrode associated with the complementary transistors, the silicide layer providing a substantially low ohmic connection with a corresponding electrode.

8. The method of claim 1, wherein the step of selectively introducing the second impurity into the third and fourth electrodes comprises implanting the third and fourth electrodes with a predetermined concentration of the second impurity.

9. The method of claim 1, further comprising the step of:

performing a controlled rapid thermal anneal on the semiconductor wafer, whereby one or more electrical characteristics of the complementary bipolar transistors are set to a desired value.

10. A method of fabricating complementary bipolar transistors on a semiconductor wafer, the method comprising the steps of:

forming a first electrode corresponding to a first transistor, and a second electrode corresponding to a second transistor which is complementary to the first transistor, the first and second electrodes being formed on an upper surface of the semiconductor wafer;

selectively introducing a first impurity into the first and second electrodes;

forming a third electrode corresponding to the first transistor, the third electrode being self-aligned with and electrically isolated from the first electrode, and forming a fourth electrode corresponding to the second transistor, the fourth electrode being self-aligned with and electrically isolated from the second electrode;

selectively introducing a second impurity into the third and fourth electrodes;

forming a first active region of the first transistor and a first active region of the second transistor, whereby at least a portion of the first impurity associated with the first and second electrodes diffuses into the first active regions of the first and second transistors; and forming a second active region of the first transistor and a second active region of the second transistor, whereby at least a portion of the second impurity associated with the third and fourth electrodes diffuses into the second active regions of the first and second transistors;

wherein the step of forming the first and second electrodes comprises the steps of:

forming a first polysilicon layer on the upper surface of the semiconductor wafer;

forming a hard mask layer on the first polysilicon layer;

selectively patterning the hard mask layer to define predetermined areas of the first polysilicon layer to be etched; and etching away the predetermined areas of the first polysilicon layer; and wherein the step of forming the first and second electrodes further comprises rapid thermal annealing the semiconductor wafer for substantially removing residual oxide between the first polysilicon layer and the upper surface of the semiconductor wafer.

11. A method of fabricating complementary bipolar transistors on a semiconductor wafer, the method comprising the steps of:

forming a first electrode corresponding to a first transistor, and a second electrode corresponding to a second transistor which is complementary to the first transistor, the first and second electrodes being formed on an upper surface of the semiconductor wafer;

selectively introducing a first impurity into the first and second electrodes;

forming a third electrode corresponding to the first transistor, the third electrode being self-aligned with and electrically isolated from the first electrode, and forming a fourth electrode corresponding to the second transistor, the fourth electrode being self-aligned with and electrically isolated from the second electrode;

selectively introducing a second impurity into the third and fourth electrodes;

forming a first active region of the first transistor and a first active region of the second transistor, whereby at least a portion of the first impurity associated with the first and second electrodes diffuses into the first active regions of the first and second transistors; and forming a second active region of the first transistor and a second active region of the second transistor, whereby at least a portion of the second impurity associated with the third and fourth electrodes diffuses into the second active regions of the first and second transistors;

wherein the step of forming the first and second electrodes comprises the steps of:

forming a first polysilicon layer on the upper surface of the semiconductor wafer;

forming a hard mask layer on the first polysilicon layer;

selectively patterning the hard mask layer to define predetermined areas of the first polysilicon layer to be etched; and etching away the predetermined areas of the first polysilicon layer;

wherein the step of forming the third and fourth electrodes comprises the steps of:

forming a second polysilicon layer on the upper surface of the semiconductor wafer;

forming a hard mask layer on the second polysilicon layer;

selectively patterning the hard mask layer to define predetermined areas of the second polysilicon layer to be etched; and etching away the predetermined areas of the second polysilicon layer; and wherein the step of forming the third and fourth electrodes further comprises rapid thermal annealing the semiconductor wafer for substantially removing residual oxide between the second polysilicon layer and the upper surface of the semiconductor wafer.

12. A method of fabricating complementary bipolar transistors on a semiconductor wafer, the method comprising the steps of:

forming a first electrode corresponding to a first transistor, and a second electrode corresponding to a second transistor which is complementary to the first transistor, the first and second electrodes being formed on an upper surface of the semiconductor wafer;

selectively introducing a first impurity into the first and second electrodes;

forming a third electrode corresponding to the first transistor, the third electrode being self-aligned with and electrically isolated from the first electrode, and forming a fourth electrode corresponding to the second transistor, the fourth electrode being self-aligned with and electrically isolated from the second electrode;

selectively introducing a second impurity into the third and fourth electrodes;

forming a first active region of the first transistor and a first active region of the second transistor, whereby at least a portion of the first impurity associated with the first and second electrodes diffuses into the first active regions of the first and second transistors; and forming a second active region of the first transistor and a second active region of the second transistor, whereby at least a portion of the second impurity associated with the third and fourth electrodes diffuses into the second active regions of the first and second transistors;

wherein the steps of forming the first, second, third and fourth electrodes comprises:

forming a first polysilicon layer on the uppers surface of the semiconductor wafer;

forming a hard mask layer on the first polysilicon layer;

selectively patterning the hard mask layer to define predetermined areas of the first polysilicon layer to be etched;

etching away the predetermined areas of the first polysilicon layer to form the first and second electrodes;

forming dielectric spacers on vertical sidewall portions of each of the first and second electrodes;

forming a second polysilicon layer on the upper surface of the semiconductor wafer;

performing a blanket etch-back of the semiconductor wafer until at least a portion of each of the dielectric spacers on the sidewalls of the first and second electrodes is detected at the upper surface of the semiconductor wafer;

selectively patterning the second polysilicon layer to define predetermined areas of the second polysilicon layer to be etched; and etching away the predetermined areas of the second polysilicon layer to form the third and fourth electrodes.

13. A method of fabricating complementary bipolar transistors on a semiconductor wafer, the method comprising the steps of:

forming a first electrode corresponding to a first transistor, and a second electrode corresponding to a second transistor which is complementary to the first transistor, the first and second electrodes being formed on an upper surface of the semiconductor wafer;

selectively introducing a first impurity into the first and second electrodes;

forming a third electrode corresponding to the first transistor, the third electrode being self-aligned with and electrically isolated from the first electrode, and forming a fourth electrode corresponding to the second transistor, the fourth electrode being self-aligned with and electrically isolated from the second electrode;

selectively introducing a second impurity into the third and fourth electrodes;

forming a first active region of the first transistor and a first active region of the second transistor, whereby at least a portion of the first impurity associated with the first and second electrodes diffuses into the first active regions of the first and second transistors;

forming a second active region of the first transistor and a second active region of the second transistor, whereby at least a portion of the second impurity associated with the third and fourth electrodes diffuses into the second active regions of the first and second transistors;

forming a dielectric layer on at least a portion of the upper surface of the semiconductor wafer such that the upper surface of the semiconductor wafer is substantially planar;

forming a plurality of contact windows at predetermined areas in the dielectric layer;

depositing a conductive layer on the upper surface of the semiconductor wafer; and selectively patterning the conductive layer to form a plurality of contacts, the contacts being electrically connected to respective electrodes associated with the complementary bipolar transistors.

* * * * *